(12) United States Patent
Suarez et al.

(10) Patent No.: US 11,211,514 B2
(45) Date of Patent: Dec. 28, 2021

(54) SHORT WAVELENGTH INFRARED OPTOELECTRONIC DEVICES HAVING GRADED OR STEPPED DILUTE NITRIDE ACTIVE REGIONS

(71) Applicant: ARRAY PHOTONICS, INC., Tempe, AZ (US)

(72) Inventors: Ferran Suarez, Chandler, AZ (US); Ding Ding, Chandler, AZ (US); Aymeric Maros, San Francisco, CA (US)

(73) Assignee: ARRAY PHOTONICS, INC., Tempe, AZ (US)

( * ) Notice: Subject to any disclaimer, the term of this patent is extended or adjusted under 35 U.S.C. 154(b) by 46 days.

(21) Appl. No.: 16/810,427

(22) Filed: Mar. 5, 2020

(65) Prior Publication Data

US 2020/0295221 A1 Sep. 17, 2020

Related U.S. Application Data

(60) Provisional application No. 62/816,718, filed on Mar. 11, 2019.

(51) Int. Cl.
*H01L 31/107* (2006.01)
*H01L 31/0304* (2006.01)

(52) U.S. Cl.
CPC .... *H01L 31/1075* (2013.01); *H01L 31/03044* (2013.01); *H01L 31/03048* (2013.01)

(58) Field of Classification Search
None
See application file for complete search history.

(56) References Cited

U.S. PATENT DOCUMENTS

| | | | |
|---|---|---|---|
| 4,127,862 A | 11/1978 | Ilegmes et al. |
| 4,179,702 A | 12/1979 | Lamorte |
| 4,404,421 A | 9/1983 | Fraas |
| 4,547,622 A | 10/1985 | Fan et al. |
| 4,682,196 A | 7/1987 | Sakai et al. |
| 4,881,979 A | 11/1989 | Lewis |
| 4,935,384 A | 6/1990 | Wanlass |

(Continued)

FOREIGN PATENT DOCUMENTS

| CN | 1917241 A | 2/2007 |
|---|---|---|
| CN | 102280587 A | 12/2011 |

(Continued)

OTHER PUBLICATIONS

Notification of the Office Action dated Apr. 20, 2021, for Taiwan Patent Application No. TW-109107936, with English translation, 29 pages.

(Continued)

*Primary Examiner* — Evren Seven
(74) *Attorney, Agent, or Firm* — Morrison & Foerster LLP

(57) ABSTRACT

Semiconductor optoelectronic devices having a dilute nitride active region are disclosed. In particular, the semiconductor devices have a dilute nitride active region with at least two bandgaps within a range from 0.7 eV and 1.4 eV. Photodetectors comprising a dilute nitride active region with at least two bandgaps have a reduced dark current when compared to photodetectors comprising a dilute nitride active region with a single bandgap equivalent to the smallest bandgap of the at least two bandgaps.

29 Claims, 14 Drawing Sheets

(56) References Cited

U.S. PATENT DOCUMENTS

| | | |
|---|---|---|
| 5,009,719 A | 4/1991 | Yoshida |
| 5,016,562 A | 5/1991 | Madan et al. |
| 5,166,761 A | 11/1992 | Olson et al. |
| 5,223,043 A | 6/1993 | Olson et al. |
| 5,316,593 A | 5/1994 | Olson et al. |
| 5,342,453 A | 8/1994 | Olson et al. |
| 5,376,185 A | 12/1994 | Wanlass |
| 5,405,453 A | 4/1995 | Ho et al. |
| 5,689,123 A | 11/1997 | Major et al. |
| 5,800,630 A | 9/1998 | Vilela et al. |
| 5,911,839 A | 6/1999 | Tsai et al. |
| 5,935,345 A | 8/1999 | Kuznicki |
| 5,944,913 A | 8/1999 | Hou et al. |
| 6,069,353 A | 5/2000 | Jung et al. |
| 6,150,603 A | 11/2000 | Karam et al. |
| 6,252,287 B1 | 6/2001 | Kurtz et al. |
| 6,281,426 B1 | 8/2001 | Olson et al. |
| 6,340,788 B1 | 1/2002 | King et al. |
| 6,504,091 B2 | 1/2003 | Hisamatsu et al. |
| 6,617,618 B2 | 9/2003 | Sato |
| 6,660,928 B1 | 12/2003 | Patton et al. |
| 6,756,325 B2 | 6/2004 | Bour et al. |
| 6,764,926 B2 | 7/2004 | Takeuchi et al. |
| 6,765,238 B2 | 7/2004 | Chang et al. |
| 6,787,385 B2 | 9/2004 | Barber et al. |
| 6,815,736 B2 | 11/2004 | Mascarenhas |
| 6,951,819 B2 | 10/2005 | Iles et al. |
| 7,045,833 B2 | 5/2006 | Campbell et al. |
| 7,071,407 B2 | 7/2006 | Faterni et al. |
| 7,119,271 B2 | 10/2006 | King et al. |
| 7,122,733 B2 | 10/2006 | Narayanan et al. |
| 7,122,734 B2 | 10/2006 | Fetzer et al. |
| 7,123,638 B2 | 10/2006 | Leary et al. |
| 7,126,052 B2 | 10/2006 | Fetzer et al. |
| 7,161,170 B1 * | 1/2007 | Yoder .................. B82Y 20/00 257/21 |
| 7,255,746 B2 | 8/2007 | Johnson et al. |
| 7,279,732 B2 | 10/2007 | Meng et al. |
| 7,709,287 B2 | 5/2010 | Fatemi et al. |
| 7,727,795 B2 | 6/2010 | Stan et al. |
| 7,807,921 B2 | 10/2010 | Fetzer et al. |
| 7,842,881 B2 | 11/2010 | Cornfeld et al. |
| 8,029,905 B2 | 10/2011 | Kouvetakis et al. |
| 8,067,687 B2 | 11/2011 | Wanlass |
| 8,093,559 B1 | 1/2012 | Rajavel |
| 8,575,473 B2 | 11/2013 | Jones et al. |
| 8,636,844 B1 | 1/2014 | Dargis et al. |
| 8,697,481 B2 * | 4/2014 | Jones-Albertus .......................... H01L 31/03048 438/94 |
| 8,716,593 B2 | 5/2014 | Meusel et al. |
| 8,912,433 B2 | 12/2014 | Jones et al. |
| 8,957,376 B1 | 2/2015 | Tkachuk et al. |
| 8,962,993 B2 | 2/2015 | Jones-Albertus et al. |
| 9,018,521 B1 | 4/2015 | Cornfeld |
| 9,153,724 B2 | 10/2015 | Jones-Albertus et al. |
| 9,214,580 B2 | 12/2015 | Misra et al. |
| 9,240,514 B2 * | 1/2016 | Gori .................. H01L 31/0687 |
| 9,252,313 B2 | 2/2016 | Meusel et al. |
| 9,257,586 B2 | 2/2016 | Meusel et al. |
| 9,502,598 B2 | 11/2016 | Meusel et al. |
| 9,741,888 B2 | 8/2017 | Meusel et al. |
| 9,748,426 B2 | 8/2017 | Meusel et al. |
| 9,768,339 B2 | 9/2017 | Yanka et al. |
| 9,786,715 B2 | 10/2017 | Na et al. |
| 2002/0000546 A1 | 1/2002 | Sato |
| 2002/0195137 A1 | 12/2002 | King et al. |
| 2003/0047752 A1 | 3/2003 | Campbell et al. |
| 2003/0070707 A1 | 4/2003 | King et al. |
| 2003/0145884 A1 | 8/2003 | King et al. |
| 2004/0045598 A1 | 3/2004 | Narayanan et al. |
| 2004/0130002 A1 | 7/2004 | Weeks et al. |
| 2004/0200523 A1 | 10/2004 | King et al. |
| 2005/0139863 A1 | 6/2005 | Welser et al. |
| 2005/0155641 A1 | 7/2005 | Fafard |
| 2005/0274409 A1 | 12/2005 | Fetzer et al. |
| 2006/0048811 A1 | 3/2006 | Krut |
| 2006/0144435 A1 | 7/2006 | Wanlass |
| 2006/0162768 A1 | 7/2006 | Wanlass et al. |
| 2007/0034853 A1 | 2/2007 | Robbins et al. |
| 2007/0113887 A1 | 5/2007 | Laih et al. |
| 2007/0131275 A1 | 6/2007 | Kinsey et al. |
| 2007/0227588 A1 | 10/2007 | Gossard et al. |
| 2008/0035939 A1 | 2/2008 | Puetz et al. |
| 2008/0149173 A1 | 6/2008 | Sharps |
| 2008/0245400 A1 | 10/2008 | Li |
| 2008/0257405 A1 | 10/2008 | Sharps |
| 2009/0001412 A1 | 1/2009 | Nagai et al. |
| 2009/0014061 A1 | 1/2009 | Harris et al. |
| 2009/0057721 A1 | 3/2009 | Miura et al. |
| 2009/0078310 A1 | 3/2009 | Stan et al. |
| 2009/0145476 A1 | 6/2009 | Fetzer et al. |
| 2009/0155952 A1 | 6/2009 | Stan et al. |
| 2009/0218595 A1 | 9/2009 | Ishimura et al. |
| 2009/0229659 A1 | 9/2009 | Wanlass et al. |
| 2009/0255575 A1 | 10/2009 | Tischler |
| 2009/0255576 A1 | 10/2009 | Tischler |
| 2009/0272438 A1 | 11/2009 | Cornfeld |
| 2009/0288703 A1 | 11/2009 | Stan et al. |
| 2010/0072457 A1 | 3/2010 | Iguchi et al. |
| 2010/0087028 A1 | 4/2010 | Porthouse et al. |
| 2010/0096001 A1 | 4/2010 | Sivananthan et al. |
| 2010/0096665 A1 | 4/2010 | MacDougal et al. |
| 2010/0116318 A1 | 5/2010 | Sumida et al. |
| 2010/0147366 A1 | 6/2010 | Stan et al. |
| 2010/0180936 A1 | 7/2010 | Kim |
| 2010/0186818 A1 | 7/2010 | Okorogu et al. |
| 2010/0218819 A1 | 9/2010 | Farmer et al. |
| 2010/0282305 A1 | 11/2010 | Sharps et al. |
| 2010/0282306 A1 | 11/2010 | Sharps et al. |
| 2010/0319764 A1 | 12/2010 | Wiemer et al. |
| 2011/0023958 A1 | 2/2011 | Masson et al. |
| 2011/0039400 A1 | 2/2011 | Yoon et al. |
| 2011/0073973 A1 | 3/2011 | Nakaji et al. |
| 2011/0114163 A1 | 5/2011 | Wiemer et al. |
| 2011/0210313 A1 | 9/2011 | Fuji et al. |
| 2011/0232730 A1 | 9/2011 | Jones et al. |
| 2011/0254052 A1 | 10/2011 | Kouvetakis et al. |
| 2011/0303268 A1 | 12/2011 | tan et al. |
| 2012/0031478 A1 | 2/2012 | Boisvert et al. |
| 2012/0103403 A1 | 5/2012 | Misra et al. |
| 2012/0153417 A1 | 6/2012 | Jin-Wei et al. |
| 2012/0167965 A1 | 7/2012 | Lin et al. |
| 2012/0211071 A1 | 8/2012 | Newman et al. |
| 2012/0216858 A1 | 8/2012 | Jones-Albertus et al. |
| 2012/0216862 A1 | 8/2012 | Abou-Kandil et al. |
| 2012/0227797 A1 | 9/2012 | Stan et al. |
| 2012/0285526 A1 | 11/2012 | Jones-Albertus et al. |
| 2013/0014815 A1 | 1/2013 | Jones-Albertus et al. |
| 2013/0074901 A1 | 3/2013 | Walukiewicz et al. |
| 2013/0112239 A1 | 5/2013 | Liptac et al. |
| 2013/0118546 A1 | 5/2013 | Jones-Albertus et al. |
| 2013/0118566 A1 | 5/2013 | Jones-Albertus et al. |
| 2013/0220409 A1 | 5/2013 | Jones-Albertus et al. |
| 2014/0182667 A1 | 7/2014 | Richards et al. |
| 2014/0261653 A1 | 9/2014 | Krause et al. |
| 2014/0326300 A1 | 11/2014 | Fuhrmann |
| 2015/0187971 A1 | 7/2015 | Sweeney et al. |
| 2015/0214412 A1 | 7/2015 | Jones-Albertus et al. |
| 2015/0221803 A1 | 8/2015 | Suarez et al. |
| 2015/0357501 A1 | 12/2015 | Derkacs et al. |
| 2016/0005909 A1 | 1/2016 | Newman |
| 2016/0118526 A1 | 4/2016 | Misra et al. |
| 2016/0190376 A1 | 6/2016 | Campesato et al. |
| 2016/0300973 A1 * | 10/2016 | Shen ................ H01L 31/18 |
| 2016/0372624 A1 * | 12/2016 | Yanka ................ H01L 31/03044 |
| 2017/0036572 A1 | 2/2017 | Hansen et al. |
| 2017/0110613 A1 | 4/2017 | Suarez et al. |
| 2017/0200845 A1 | 7/2017 | King et al. |
| 2017/0338357 A1 | 11/2017 | Liu et al. |
| 2019/0013430 A1 | 1/2019 | Jones-albertus |
| 2019/0252567 A1 * | 8/2019 | Yoon ................ H01L 31/03048 |

(56) References Cited

U.S. PATENT DOCUMENTS

| | | | |
|---|---|---|---|
| 2019/0280143 A1* | 9/2019 | Ding | H01L 31/056 |
| 2019/0288147 A1* | 9/2019 | Misra | H01L 31/0725 |
| 2020/0212237 A1* | 7/2020 | Roucka | H01L 33/32 |

FOREIGN PATENT DOCUMENTS

| | | | |
|---|---|---|---|
| CN | 103426965 A | 12/2013 | |
| JP | 63100781 A | 5/1988 | |
| JP | 6061513 A | 3/1994 | |
| JP | 6061516 A | 3/1994 | |
| JP | 10012905 A | 1/1998 | |
| JP | 2006-270060 A | 10/2006 | |
| JP | 2008-270760 A | 11/2008 | |
| TW | 200721518 A | 6/2007 | |
| TW | 200924214 A | 6/2009 | |
| TW | 201228004 A | 7/2012 | |
| TW | 201316382 A | 4/2013 | |
| TW | 201436252 A | 9/2014 | |
| WO | 2010/130421 A1 | 11/2010 | |
| WO | 2010/151553 A1 | 12/2010 | |
| WO | 2011/062886 A1 | 5/2011 | |
| WO | 2011/123164 A1 | 10/2011 | |
| WO | 2012/057874 A1 | 5/2012 | |
| WO | 2012/115838 A1 | 8/2012 | |
| WO | 2012/154455 A1 | 11/2012 | |
| WO | 2018/078348 A1 | 5/2018 | |
| WO | 2019/067553 A1 | 4/2019 | |

OTHER PUBLICATIONS

International Search Report and Written Opinion dated Jun. 29, 2020, for PCT Application No. PCT/US2020/021266, filed Mar. 5, 2020, fifteen pages.

Baghdasaryan, H.V. et al., "Wavelength-Scale Analysis of Influence of Chirped DBRs on Optical Characteristics of Multinanolayer Photovoltaic Cells," ICTON 2016, We.P.33, 5 pages.

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

Bank et al., "Recent Progress on 1.55-um Dilute-Nitride Lasers," IEEE Journal of Quantum Electronics, Sep. 2007, vol. 43, No. 9, 13 pages.

Baranowski et al., "Time-resolved photoluminescence studies of annealed 1.3-um GaInNAsSb quantum wells," Nanoscale Research Lettesr, 2014, vol. 9, No. 81, 5 pages.

Baribeau et al., "Heteroepitaxy of Ge on (100) Si substrates," Journal of Vacuum Science & Technology, Jul./Aug. 1987, A 5 (4), 6 pages.

Bertness et al., "29.5%-Efficient GaInP/GaAs Tandem Solar Cells," Applied Physics Letters, vol. 65, Aug. 22, 1994, pp. 989-991.

Bett et al., "III-V Solar Cells Under Monochromatic Illumination", IEEE transactions on Electron Devices, 2008, 5 pages.

Bhuiyan et al., "InGaN Solar Cells: Present State of the Art and Important Challenges", IEEE Journal of Photovoltaics, vol. 2, No. 3, Jul. 2012, p. 246-293.

Campesato, Roberta, et al., "31% European INGAP/GAAS/INGANAS Solar Cells for Space Application", Proceedings of the 11th European Space Power Conference 2016 (ESPC 2016), Published May 23, 2017, 5 pages.

Cheah et al., "GaAs-Based Heterojunction p-i-n Photodetectors Using Pentanary InGaAsNSb as the Intrinsic Layer," IEEE Photonics Technology Letters, Sep. 2005, vol. 17, No. 9, 3 pages.

Chang, S.J. et al., "Chirped GaAs—AlAs Distributed Bragg Reflectors for High Brightness Yellow-Green Light-Emitting Diodes," Photonics Technology Letters, Feb. 1997, vol. 9, No. 2, p. 182-184.

Chen et al., "GaAsSbN/GaAs long wavelength PIN detectors," Indium Phosphide and Related Materials, 2008, 20th International Conference on Versailles, 4 pages.

Cornfeld et al., "Evolution of a 2.05 eV AlGaInP Top Sub-cell for 5 and 6J-IMM Applications", Photovoltaic Specialists Conference (PVSC), 38th IEEE, Jun. 3, 2012, p. 2788-2791.

Cotal et al., "III-V multijunction solar cells for concentrating photovoltaics" pp. 174-192, www.rsc.org/ees, Energy and Environmental Science 2, (2009).

Dargis et al., "Growth and application of epitaxial heterostructures with polymorphous rare-earth oxides," Journal of Crystal Growth, 2013, vol. 378, p. 177-179.

Dargis et al., "Monolithic integration of rare-earth oxides and semiconductors for on-silicon technology," J. Vac. Sci. Tech., Aug. 2014, vol. 32, No. 4, p. 041506.

David et al., "Material Considerations for Avalanche Photodiodes," IEEE Journal of Selected Topics in Quantum Electronics, Jul./Aug. 2008, vol. 14, No. 4, p. 998-1009.

Denton et al., Vegard's Law, Physical Review, A, The American Physical Society, vol. 43 No. 6, pp. 3161-3164 (1991).

Edmund. "Dichroic Longpass Filters", Edmund Optics Worldwide, Product Catalog, Feb. 2001, 9 pages, retrieved from https://www.edmundoptics.com/f/dichroic-longpass-filters/14288/.

Ferguson et al., "Optical Gain in GaInNAs and GaInNAsSb Quantum Wells," IEEE Journal of Quantum Electronics, Jun. 2011, vol. 47, No. 6, 8 pages.

Ferguson et al., Nonradiative Recombination in 1.56 μm GaInNAsSb/GaNAs Quantum-Well Lasers, pp. 1-3, published online Dec. 8, 2009, Applied Physics Letters 95, 231104.

Fewster P.F., "X-Ray Scattering From Semiconductors" Second Edition, Imperial College Press, London, 2003, Ch. 1, pp. 1-22.

Fitzgerald et al., "Dislocations in Relaxed SiGe/Si Heterostructures," Phys. Stat. Sol., 1999, vol. 171, p. 227-238.

Friedman et al., "1-eV Solar cells with GaInNAs active layer", Journal of Crystal Growth, vol. 195, 1998, p. 409-415.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.

Garcia, I. et al., "Design of Semiconductor-Based Back Reflectors for High Voc Monolithic Multijunction Solar Cells," IEEE Photovoltaic Specialists Conference, Austin Texas, Jun. 3-8, 2012, 8 pages.

Garcia et al., Analysis of Tellurium As N-Type Dopant in GaInP: Doping, Diffusion, Memory Effect and Surfactant Properties, pp. 794-799, Journal of Crystal Growth 298 (2007).

Garcia et al., "Degradation of subcells and tunnel junctions during growth of GaInP/Ga(In)As/GaNAsSb/Ge 4-junction solar cells," Progress in Photovoltaics, Aug. 2017, 9 pages.

Geelen et al., Epitaxial Lift-Off GaAs Solar Cell From a Reusable GaAs Substrate, pp. 162-171, Materials Science and Engineering B45 (1997).

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Gobet et al., "GaInNAsSb/GaAs vertical cavity surface-emitting lasers (VCSELs): Current challenges and techniques to realize multiple-wavelength laser arrays at 1.55um," Proc. of SPIE, Feb. 2008, vol. 6908, 13 pages.

Green et al., Progress in Photovoltaics: Research and Applications 19 (2011) pp. 565-572.

Green et al., Progress in Photovoltaics: Research and Applications 20 (2012) pp. 12-20.

Green, "Third Generation Photovoltaics: Advanced Solar Energy Conversion," pp. 95-109, Springer Publishing, Berlin, Germany (2003).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

(56) References Cited

OTHER PUBLICATIONS

Gu et al. "Gas Source Growth and Doping Characteristics of AlInP on GaAs" Materials Science and Engineering B 131 (2006), pp. 49-53.

Gubanov et al., "Dynamic of time-resolved photoluminescence in GaInNAs and GaNAsSb solar cells," Nanoscale Research Letters, 2014, vol. 9, No. 80, 4 pages.

Han et al., "1.55 um GaInNAs resonant-cavity-enhanced photodetector grown on GaAs," Applied Physics Letters, 2005, vol. 87, 111105.

Harris Jr. et al., "Development of GainNAsSb alloys: Growth, band structure, optical properties and applications," 2007, Physics Status Solidi(b), vol. 244, Issue 8, p. 2707-2729.

Harris Jr. et al., "The opportunities, successes and challenges for GaInNAsSb," Journal of Crystal Growth, Mar. 2005, vol. 278, p. 3-17.

Heroux et al., "GaInNAs resonant-cavity-enhanced photodetector operating at 1.3 um," Applied Physics Letters, Nov. 1999, vol. 75, No. 18, p. 2716-2718.

Heroux et al., "Dilute Nitride Photodetector and Modulator Devices," Dilute III-V Nitride Semiconductors and Material Systems, Materials Science, Jan. 2008, vol. 105, pp. 563-586.

Hovel H.J., "Semiconductors and Semimetals", Academic Press, New York, 1975, Ch. 2, pp. 8-47.

Huang, Jie et al., "Four-junction AlGaAs/GaAs laser power converter," Journal of Semiconductors, Apr. 2018, vol. 39, No. 4, 044003, 5 pages.

Jackrel et al., "Thick lattice-matched GaInNAs films in photodetector applications," Proc. of SPIE, 2005, vol. 5728, p. 27-34.

Jackrel, D. B., "InGaAs and GaInNAs(Sb) 1064 NM Photodectectors and Solar Cells on GaAs Substrates," A Dissertation submitted to the Department of Materials Science and Engineering and the Committee on Graduate Studies of Stanford University, 2005, 264 pages.

Jackrel et al., "Dilute Nitride GaInNAs and GaInNAsSb Solar Cells by Molecular Beam Epitaxy," Journal of Applied Physics, 2007, vol. 101, p. 114916.

Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.

Jackrel et al., "Dilute nitride GainNAs and GainNAsSb solar cells by molecular beam epitaxy", Journal of Applied Physics 2007, 101, p. 114916.

Janotti et. al., Mutual Passivation of Electrically Active and Isovalent Impurities in Dilute Nitrides, Physical Review Letters 100, 045505 (2008).

Janotti et al., "Effects of Hydrogen on the Electronic Properties of Dilute GaAsN Alloys," The American Chemical Society, Aug. 2002, vol. 89, No. 8, p. 086403.

Ketlhwaafetse, Richard, "Comparative Study of Dilute Nitride and Bismide Sub-Junctions for Tandem Solar Cells," A thesis for Ph.D. in applied physics, University of Essex, Jan. 2016, 175 pages.

Khalil et al., "Photoconductivity and photoluminescence under bias in GaInNAs/GaAs MQW p-i-n structures," Nanoscale Research Letter, 2012, vol. 7, No. 539, 4 pages.

Kim et al., "Characteristics of bulk InGaInNAs and InGaAsSbN materials grown by metal organic vapor phase epitaxy (MOVPE) for solar cell application," Proc. of SPIE, 2012, vol. 8256, 8 pages.

Kim et al., "Characteristics of bulk InGaAsSbN/GaAs grown by metalorganic vapor phase epitaxy (MOVPE)," Journal of Crystal Growth, 2013, p. 163-167.

King et al., "High-Voltage, Low-Current GaInP/GaInP/GaAs/GaInNAs/Ge Solar Cells" Spectrolab Inc., 2002, pp. 852-855.

King et al., "40% Efficient Metamorphic GaInP/GaInAs/Ge Multijunction Solar Cells," J. of Applied Physics Letters, May 4, 2007.

Kinsey et al., "GaNAs resonant-cavity avalanche photodiode operating at 1.064 um," Applied Physics Letters, Sep. 2000, vol. 77, No. 10, p. 1543-1544.

Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.

Kudrawiec et al., "Band Gap Discontinuity in Ga0.9ln0.1N0.027As0.973-xSbx/GaAs Single Quantum Wells with 0<x<0.06 Studied by Contactless Electroreflectance Spectroscopy", Applied Physics Letters, 2006, vol. 88, p. 221113.

Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.

Kurtz et al., "Projected Performance of Three and Four-Junction Devices Using GaAs and GaInP," pp. 875-878, 26th IEEE Photovoltaics Specialists Conference, 1997.

Langer et al., "Graded band gap GaInNAs solar cells", Applied Physics Letters, 2015, vol. 106, p. 233902.

Law et al., "Future technology pathways of terrestrial III-V multijunction solar cells for concentrator photovoltaic systems," Solar Energy Materials & Solar Cells 94 (2010) pp. 1314-1318.

Le Du et al., "Quantum-well saturable absorber at 1.55 um on GaAs substrate with a fast recombination rate," Applied Physics Letters, 2006, vol. 88, 201110.

Loke, W.K. et al., "Improvement of GaInNAs p-i-n photodetector responsivity by antimony incorporation," Journal of Applied Physics, 2007, vol. 101, p. 033122.

Magden et al., "Transmissive silicon photonic dichroic filters with spectrally selective eaveguides", Nature Communications, Aug. 2019, 10 pages, retrieved from https://www.nature.com/articles/s41467-018-05287-1.

Mawst et al., "Dilute-Nitride-Antimonide Materials Grown by MOVPE for Multi-Junction Solar Cell Application," The Electrochemical Society, 2015, vol. 66, No. 7, p. 101-108.

Merrill et al, Directions and Materials Challenges in High Performance Photovoltaics, Dec. 2007, JOM Energetic Thin Films, 59, 12, 26-30.

Miller et al., "GaAs—AlGaAs tunnel junctions for multigap cascade solar cells", Journal of Applied Physics, vol. 53, No. 1, Jan. 1982, p. 744-748.

Miyashita, N., et al., "Incorporation of Hydrogen into MBE-Grown Dilute Nitride GaInNAsSb Layers in a MOCVD Growth Ambient", Solar Energy Materials and Solar Cells, vol. 185, 2018, pp. 359-363.

Miyashita et al., "Generation and collection of photocarriers in dilute nitride GaInNAsSb solar cells," Progress in Photovoltaics: Research and Applications, 2016, vol. 24, p. 28-37.

Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.

Miyashita et al., "Improvement of GaInNAsSb films fabricated by atomic hydrogen-assisted molecular beam epitaxy", pp. 3249-3251, Journal of Crystal Growth 311, 2009.

Miyashita, N. et al., "Characterization of 1.0 EV GaInNAsSb Solar Cells for Multijunction Applications and the Effect of Annealing," 31st European Photovoltaic Solar Energy Conference and Exhibition, Sep. 2015, p. 1461-1465.

Ng et al., "InGaAsN as Absorber in APDs for 1.3 micron Wavelength Applications," Indium Phosphide & Related Materials, 2010 International Conference, May 2010, p. 1-4.

Ng et al., "Long wavelength bulk GaInNAs p-i-n photodiodes lattice matched to GaAs," Journal of Applied Physics, 2007, vol. 101, 064506, 6 pages.

Ng et al., "Molecular beam epitaxy growth of bulk GaNAsSb on Ge/graded-SiGe/Si substrate," Journal of Crystal Growth, 2009, vol. 311, p. 1754-1757.

Ng et al., 1EV GANXAS1-X-YSBY Material for Lattice-Matched III-V Solar Cell Implementation on GAAS and GE, pp. 76-80, (2009).

Ni et al., "Optimization of GaInNAs(Sb)/GaAs quantum wells at 1.3-1.55 um grown by molecular beam epitaxy," Journal of Crystal Growth, 2007, vol. 301-302, p. 125-128.

Niu et al., "GaAs-based room-temperature continuous-wave 1.59um GaInNAsSb single-quantum-well laser diode grown by molecular-beam epitaxy," Applied Physics Letters, Dec. 2005, vol. 87, No. 23, 4 pages.

(56) References Cited

OTHER PUBLICATIONS

Ochoa, M. et al., "Advances Towards 4J Lattice-Matched including Dilute Nitride Subcell for Terrestrial and Space Applications," 43rd Photovoltaic Specialists Conference, 2016, p. 52-57.

Ohnaka et al., "A Low Dark Current InGaAs/InP p-i-n Photodiode with Covered Mesa Structure," IEEE Transactions on Electron Devices, Feb. 1987, vol. Ed-34, No. 2, 6 pages.

Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.

Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.

Pena et al., "The Influence of Monolithic Series Connection on the Efficiency of GaAs Photovoltaic Converters for Monochromatic Illumination," Transactions on Electron Devices, Feb. 2001, vol. 48, No. 2, p. 196-203.

Polojarvi et al., "Comparative study of defect levels in GaInNAs, GaNAsSb, and GaInNAsSb for high-efficiency solar cells," Applied Physics Letters, 2016, vol. 108, p. 122104.

Ptak et al., "A comparison of MBE- and MOCVD-grown GaInNAs," Journal of Crystal Growth, 2003, vol. 251, p. 392-398.

Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).

Ptak et al., "Low-acceptor-Concentration GaInNAs grown by Molecular-beam Epitaxy for High-current p-i-n solar cell applications." J. of Applied Physics, 98.094501 (2005).

Ptak et al., "Defects in GaInNAs: What We've Learned so Far" National Renewable Energy Laboratory NREL/CP-520-33555, May 2003, 7 pages.

Sabnis et al., A new roadmap for space solar cells, Industry Photovoltaics, www.compoundsemiconductor.net/csc/features-details/19735471, Aug./Sep. 2012, 5 pages.

Saka, T. et al., "Bragg reflector of GaAlAs/AlAs layers with wide bandwidth applicable to light emitting diodes," Journal of Applied Physics, 1993, vol. 73, No. 380, p. 380-383.

Schubert et al., "High-Voltage GaAs Photovoltaic Laser Power Converters", IEEE transactions on Electron Devices, Feb. 2009, vol. 56, No. 2, p. 170-175.

Sin et al., "Carrier Dynamics in MOVPE-Grown Bulk Dilute Nitride Materials for Multi-Junction Solar Cells," Proc. of SPIE, 2011, vol. 7933, 11 pages.

Solar Junction Inc., "Sharp Develops Solar Cell with Word's Highest Conversion Efficiency of 35.8%" Press Release, dated Oct. 22, 2009, 3 pages.

Suarez, F., et al., "Advances in Dilute Nitride Multi-Junction Solar Cells for Space Power Applications", Proceedings of the 11th European Space Power Conference 2016 (ESPC 2016), Published May 23, 2017, 3 pages.

Takeda et al., "Electron mobility and energy gap of In0.53 Ga0.47As on InP substrate," Journal of Applied Physics, Dec. 1976, vol. 47, No. 12, p. 5405-5408.

Tan et al., "Reduction of dark current and unintentional background doping in InGaAsN photodetectors by ex situ annealing," Proc. of SPIE, 2010, vol. 7726, 8 pages.

Tan et al., "Molecular beam epitaxy grown GaNAsSb 1 eV photovoltaic cell," Journal of Crystal Growth, 2011, vol. 335, p. 66-69.

Tan et al., "GaInNAsSb/GaAs Photodiodes for Long-Wavelength Applications," Electron-Device Letters, Jul. 2011, vol. 32, No. 7, p. 919-921.

Tan et al., "Dilute nitride GaInNAs and GaInNAsSb for solar cell applications," Proc. of SPIE, 2012, vol. 8256, 10 pages.

Tan et al., "Improved Optoelectronic Properties of Rapid Thermally Annealed Dilute Nitride GaInNAs Photodetectors," Journal of Electronic Materials, 2012, vol. 41, No. 12, p. 3393-3401.

Tan et al., "High responsivity GaNAsSb p-i-n photodetectors at 1.3um growth by radio-frequency nitrogen plasma-assisted molecular beam epitaxy," Optics Express, May 2008, vol. 16, No. 11, p. 7720-7725.

Tan et al., "Experimental evaluation of impact ionization in dilute nitride GaInNAs diodes," Applied Physics Letters, 2013, vol. 103, p. 102101.

Tobin, S.P. et al., "Enhanced Light Absorption in GaAs Solar Cells with Internal Bragg Reflectors," IEEE Photovoltaic Specialists Conference, Oct. 1991, p. 147-152.

Thomas, Daniel Tomos. "Investigation of material and device properties of GaAsSbN for multi-junction solar cell applications," Jun. 2017, Thesis, Imperial College London, Department of Physics, 25 pages.

Thorlabs. "Longpass Dichroic Mirrors/Beamsplitters", Product Description, Sep. 29, 2008, 15 pages, retrieved from https://www.thorlabs.com/newgrouppage9.cfm?objectgroup_id=3313.

Trotta, R. et al., "Hydrogen diffusion in GaAs1-xNx," The American Physical Society Review, 2009, vol. 80, p. 195206.

Tukiainen, A. et al., "High-efficiency GaInP/GaAs/GaInNAs solar cells grown by combined MBE-MOCVD technique," Progress in Photovoltaics, Research and Applications, May 2016, vol. 24, p. 914-919.

Tukiainen, A., et al., "Improving the current output of GaInNAs solar cells using distributed Bragg reflectors," IEEE 43rd Photovoltaic Specialists Conference, Jun. 2016, 4 pages.

Unlu, M.S., "Resonant cavity enhanced photonic devices," Journal of Applied Physics Reviews, American Institute of Physics, Jul. 1995, vol. 76, p. 607-632.

Volz et al., Optimization of Annealing Conditions of (GaIn)(NAs) for Solar Cell Applications, pp. 2222-2228, Journal of Crystal Growth 310 (2008).

Volz et al., MOVPE growth of dilute nitride III/V semiconductors using all liquid metalorganic precursors, Journal of Crystal Growth 311 (2009), pp. 2418-2526.

Wicaksono et al., "Effect of growth temperature on defect states of GaAsSbN intrinsic layer in GaAs/GaAsSbN/GaAs photodiode for 1.3 um application," Journal of Applied Physics, 2007, vol. 102, p. 044505.

Wiemer et al., "43.5% Efficient Lattice Matched Solar Cells" Proc. SPIE 810804, High and Low Concentrator Systems for Solar Electric Applications VI (Sep. 19, 2011).

Wistey et al., "Monolithic, GaInNAsSb VCSELs at 1.46um on GaAs by MBE," Electronics Letters, Dec. 2003, vol. 39, No. 25, 2 pages.

Wistey et al., Nitrogen Plasma Optimization for High-Quality Dilute Nitrides, pp. 229-233, Journal of Crystal Growth, available online on Feb. 1, 2005 at http://www.sciencedirect.com.

Wilkins, M., "Multi-junction solar cells and photovoltaic power converters: high-efficiency designs and effects of luminescent coupling," Ph.D. Dissertation, University of Ottawa, Jun. 2017, 152 pages.

Wu et al., Band Anticrossing in Highly Mismatched III-V Semiconductor Alloys, pp. 860-869, Semiconductor Science and Technology 17 (2002).

Xin et al., "Effects of hydrogen on doping of GaInNAs grown by gas-source molecular beam epitaxy," Journal of Vacuum Science and Technology, 2000, vol. 18, p. 1476-1479.

Yamaguchi et al., "Multi-junction III-V solar cells: current status and future potential", in: Solar Energy, vol. 79, issue 1, Jul. 2005.

Yoon, Soon F., et al., "Recent Progress in Dilute Nitride-Antimonide Materials for Photonic and Electronic Applications", ECS Transactions, 2009, XP055524397, pp. 5-29.

Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).

Yuen, "Growth and Characterization of Dilute Nitride Antimonides for Long-Wavelength Optoelectronics," a dissertation submitted to the department of materials science and engineering and the committee on graduate studies of Stanford University in partial fulfillment of the requirements for the degree of doctor of philosophy, Mar. 2006, 203 pages.

(56) References Cited

OTHER PUBLICATIONS

Yuen, "The role of antimony on properties of widely varying GaInNAsSb compositions", Journal of Applied Physics, May 2006, vol. 99, p. 093504-1 to 093804-8.
E. Wesoff, "Update: Solar Junction breaking CPV efficiency records, raising $30M", Greentech Meda, Apr. 15, 2011, 4 pages.
E. Wesoff, "CPV Roundup: SolFocus funding, 5MW order for Solar Junction, GreenVolts, Amonix", Greentech Media, May 22, 2012, 3 pages.
E. Wesoff, "Record 44 percent CPV efficiency from startup Solar Junction", Greentech Media, Oct. 15, 2012, 3 pages.
Weyers et al., "Red shift of photoluminescence and absorption in dilute GaAsN alloy layers", Japan Journal of Applied Physics, vol. 31, Issue 7A, 1992, p. L853-L855.
International Search Report and Written Opinion PCT/US2008/008495 dated Apr. 6, 2009, 5 pages.
International Preliminary Report on Patentability PCT/US2008/008495 dated Jan. 12, 2010, 5 pages.
International Search Report and Written Opinion corresponding to the PCT application No. PCT/US10/39534, dated Sep. 8, 2010, 8 pages.
International Search Report and Written Opinion corresponding to the PCT application No. PCT/US10/56800, dated Jan. 26, 2011, 8 pages.
International Search Report and Written Opinion corresponding to the PCT application No. PCT/US2010/061635, dated Mar. 1, 2011, 7 pages.
International Search Report and Written Opinion corresponding to the PCT application No. PCT/US11/36486, dated Aug. 25, 2011, 12 pages.
International Preliminary Report on Patentability for PCT Application No. PCT/US2010/056800, dated May 31, 2012, 6 pages.
International Search Report and Written Opinion of the International Searching Authority for PCT Application No. PCT/US 12/36020, dated Aug. 14, 2012, 11 pages.
International Search Report and Written Opinion of the International Searching Authority for PCT Application No. PCT/US 12/25307, dated Aug. 16, 2012, 13 pages.
International Search Report and Written Opinion corresponding to PCT Application No. PCT/US2015/014650, dated May 20, 2015, 13 pages.
International Preliminary Report on Patentability for Application No. PCT/US2015/014650, dated Aug. 9, 2016, 21 pages.
International Search Report and Written Opinion for PCT Application No. PCT/US2013/033567, dated Mar. 4, 2014, 12 pages.
International Search Report and Written Opinion for PCT Application No. PCT/US2016/038567, dated Jun. 21, 2016, 15 pages.
International Search Report and Written Opinion for PCT Application No. PCT/US2018/039544, dated Sep. 10, 2018, 15 pages.
International Search Report and Written Opinion for PCT Application No. PCT/US2018/052873, dated Nov. 22, 2018, 12 pages.
International Search Report and Written Opinion for PCT Application No. PCT/US2019/021598, dated Jun. 14, 2019, 13 pages.
International Search Report and Written Opinion for PCT Application No. PCT/US2019/036857, dated Aug. 23, 2019, 18 pages.
International Search Report and Written Opinion for PCT Application No. PCT/US2019/048533, dated Jan. 2, 2020, 10 pages.
Examination Report for European Application No. 15704681.4, dated Sep. 30, 2019, 7 pages.
Written Opinion for Singapore Application No. 11201606353T, dated Aug. 16, 2017, 6 pages.
Non-Final Office Action for U.S. Appl. No. 14/614,601, dated Jan. 23, 2017, 11 pages.
Non-Final Office Action of Jun. 10, 2010 for U.S. Appl. No. 12/217,818, 15 pages.
Final Office Action of Jan. 1, 2011 for U.S. Appl. No. 12/217,818, 15 pages.
Non-Final Office Action dated Feb. 13, 2013 for U.S. Appl. No. 12/819,534, 8 pages.
Final Office Action dated Sep. 9, 2013 for U.S. Appl. No. 13/819,534, 13 pages.
Non-Final Office Action for U.S. Appl. No. 12/819,534, dated Sep. 16, 2015, 10 pages.
Non-Final Office Action dated Oct. 5, 2012 for U.S. Appl. No. 12/944,439, 15 pages.
Final Office Action dated May 29, 2013 for U.S. Appl. No. 12/944,439, 17 pages.
Non-Final Office Action for U.S. Appl. No. 12/944,439, dated Aug. 13, 2014, 11 pages.
Non-Final Office Action dated Oct. 24, 2012 for U.S. Appl. No. 12/749,076, 17 pages.
Non-Final Office Action dated May 24, 2013 for U.S. Appl. No. 13/739,989, 7 pages.
Non-Final Office Action dated Dec. 14, 2012 for U.S. Appl. No. 13/618,496, 16 pages.
Final Office Action dated Feb. 6, 2013 for U.S. Appl. No. 13/618,496, 8 pages.
Notice of Allowance dated Mar. 22, 2013 for U.S. Appl. No. 13/618,496, 8 pages.
Amendment, Affidavits under 37 C.F.R. §132, and Information Disclosure Statement filed Nov. 2013 for U.S. Appl. No. 13/739,989, 51 pages.
Final Office Action dated Feb. 26, 2014, for U.S. Appl. No. 13/739,989, 16 pages.
Notice of Allowance for U.S. Appl. No. 13/739,989, dated Sep. 30, 2014, 9 pages.
Declaration Under 37 C.F.R. § 1.132 of Homan Yuen filed for U.S. Appl. No. 13/739,989 on Nov. 15, 2013, pp. 1-10.
Declaration Under 37 C.F.R. § 1.132 of Jerry Olson filed for U.S. Appl. No. 13/739,989 on Nov. 15, 2013, pp. 1-5.
Declaration Under 37 C.F.R. § 1.132 of Minjoo Lee filed for U.S. Appl. No. 13/739,989 on Nov. 15, 2013, pp. 1-6.
Notice of Allowance for U.S. Appl. No. 14/512,224, dated Jan. 30, 2015, 8 pages.
Notice of Allowance for U.S. Appl. No. 14/678,737, dated Oct. 27, 2015, 18 pages.
Non-Final Office Action for U.S. Appl. No. 14/678,737, dated Jul. 6, 2015, 13 pages.
Non-Final Office Action dated Feb. 15, 2013 for U.S. Appl. No. 12/914,710, 14 pages.
Final Office Action dated Sep. 6, 2013 for U.S. Appl. No. 12/914,710, 17 pages.
Notice of Allowance for U.S. Appl. No. 14/914,710, dated Sep. 25, 2015, 13 pages.
Non-Final Office Action for U.S. Appl. No. 13/370,500, dated Dec. 31, 2013, 7 pages.
Notice of Allowance for U.S. Appl. No. 13/370,500, dated Sep. 22, 2014.
Non-Final Office Action dated Nov. 8, 2012 for U.S. Appl. No. 13/104,913, 12 pages.
Notice of Allowance for U.S. Appl. No. 13/104,913, dated Feb. 21, 2014, 8 pages.
Final Office Action dated Oct. 2, 2013 for U.S. Appl. No. 13/104,913, 12 pages.
Non-Final Office Action dated Apr. 15, 2013 for U.S. Appl. No. 13/708,763, 23 pages.
Non-Final Office Action dated Apr. 25, 2013 for U.S. Appl. No. 13/708,791, 16 pages.
Non-Final Office Action for U.S. Appl. No. 13/678,389, dated Feb. 20, 2014, 13 pages.
Non-Final Office Action for U.S. Appl. No. 13/678,389, dated Jul. 6, 2015, 11 pages.
Final Office Action for U.S. Appl. No. 13/678,389, dated Oct. 10, 2014, 15 pages.
Notice of Allowance for U.S. Appl. No. 13/708,763, dated Feb. 20, 2014, 9 pages.
Final Office Action dated Oct. 1, 2013 for U.S. Appl. No. 13/708,791, 15 pages.
Notice of Allowance for U.S. Appl. No. 13/708,791, dated Oct. 31, 2014.
Non-Final Office Action for U.S. Appl. No. 13/894,245, dated Jun. 24, 2015, 19 pages.

(56) References Cited

OTHER PUBLICATIONS

Notice of Allowance for U.S. Appl. No. 13/442,146, dated Jul. 7, 2015, 7 pages.
Non-Final Office Action dated Mar. 21, 2014, for U.S. Appl. No. 13/442,146, 6 pages.
Non-Final Office Action for U.S. Appl. No. 16/051,109, dated Oct. 30, 2018, 11 pages.
Final Office Action for U.S. Appl. No. 16/051,109, dated Feb. 1, 2019, 11 pages.
Search Report for Singapore Application No. 11201606353T, dated Jun. 22, 2018, 7 pages.
Final Office Action for U.S. Appl. No. 14/614,601, dated May 17, 2018, 13 pages.
Non-Final Office Action for U.S. Appl. No. 16/018,917, dated Oct. 16, 2018, 12 pages.
Non-Final Office Action for U.S. Appl. No. 16/018,917, dated Sep. 5, 2019, 31 pages.
Final Office Action for U.S. Appl. No. 16/018,917, dated Mar. 22, 2019, 21 pages.
Aho et al., "Determination of Composition and Energy Gaps of GaInNAsSb Layers Grown by MBE," Journal of Crystal Growth, 2016, vol. 438, p. 49-54.
Aho., "Dilute Nitride Multijunction Solar Cells Grown by Molecular Beam Epitaxy," Ph.D. Dissertation, Tampere University of Technology, Nov. 2015, vol. 1343, p. 44.
Aho, Arto, "Dilute Nitride Multijunction Solar Cells Grown by Molecular Beam Epitaxy", PhD Dissertation, Tampere University of Technology, Publication, vol. 1343, Nov. 14, 2015, XP055524070, pp. 1-80.
Andreev et al., "High Current Density GaAs and GaSb Photovoltaic Cells for Laser Power Beaming", 3rd World Conference on Photovoltaic Energy conversion, May 11-18, 2003, Osaka, Japan, 4 pages.
Campesato et al., "31% European InGaP/GaAs/InGaNAs Solar Cells for Space Application," E3S Web of Conferences, 2017, vol. 16, 5 pages.
Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.
Kudrawiec et al., "Band Gap Discontinuity in Ga0.9In0.1N0.027As0.973-xSbx/GaAs Single Quantum Wells with 0<x<0.06 Studied by Contactless Electroreflectance Spectroscopy", Applied Physics Letters, 2006, vol. 88, p. 221113.
Le Du et al., "Quantum-well saturable absorber at 1.55 urn on GaAs substrate with a fast recombination rate," Applied Physics Letters, 2006, vol. 88, 201110.

Miyashita et al., Effect of Indium Composition on GaInNAsSb Solar Cells Grown by Atomic Hydrogen-Assisted Molecular Beam Epitaxy, p. 000632-000635, 978-1-4244-2950@ 2009 IEEE.
Thomas, Tomos Daniel, "Investigation of Material and Device Properties of GaAsSbN for Multi-Junction Solar Cell Applications", Thesis, Jun. 6, 2017, XP055524108, pp. 1-188.
E. Wesoff, "Update: Solar Junction breaking CPV efficiency records, raising $30M", Greentech Media, Apr. 15, 2011, 4 pages.
International Search Report and Written Opinion corresponding to the PCT application No. PCT/US2010/039534, dated Sep. 8, 2010, 8 pages.
International Search Report and Written Opinion corresponding to the PCT application No. PCT/US2010/056800, dated Jan. 26, 2011, 8 pages.
International Search Report and Written Opinion corresponding to the PCT application No. PCT/US2011/36486, dated Aug. 25, 2011, 12 pages.
International Search Report and Written Opinion of the International Searching Authority for PCT Application No. PCT/US2012/36020, dated Aug. 14, 2012, 11 pages.
International Search Report and Written Opinion of the International Searching Authority for PCT Application No. PCT/US2012/25307, dated Aug. 16, 2012, 13 pages.
International Search Report for PCT Application No. PCT/US2018/052873, dated Nov. 22, 2018, 12 pages.
International Search Report for PCT Application No. PCT/US2019/036857, dated Aug. 23, 2019, 18 pages.
International Search Report for PCT Application No. PCT/US2019/048533, dated Jan. 2, 2020, 10 pages.
Non-Final Office Action dated Jun. 10, 2010 for U.S. Appl. No. 12/217,818, 15 pages.
Final Office Action dated Jan. 1, 2011 for U.S. Appl. No. 12/217,818, 15 pages.
Non-Final Office Action of Oct. 5, 2012 for U.S. Appl. No. 12/944,439, 15 pages.
Notice of Allowance for U.S. Appl. No. 12/914,710, dated Sep. 25, 2015, 13 pages.
Non-Final Office Action dated Dec. 31, 2013, for U.S. Appl. No. 13/370,500, 7 pages.
Final Office Action for U.S. Appl. No. 13/678,389, mailed on Oct. 10, 2014, 15 pages.
Final Office Action dated Sep. 9, 2013 for U.S. Appl. No. 12/819,534, 13 pages.
International Preliminary Report and Written Opinion dated Sep. 23, 2021, for PCT Application No. PCT/US2020/021266, filed Mar. 5, 2020, nine pages.

* cited by examiner

SHORT WAVELENGTH INFRARED OPTOELECTRONIC DEVICES HAVING GRADED OR STEPPED DILUTE NITRIDE ACTIVE REGIONS

This application claims the benefit under 35 U.S.C. § 119(e) of U.S. Provisional Application No. 62/816,718 filed on Mar. 11, 2019, which is incorporated by reference in its entirety.

FIELD

The disclosure relates to shortwave infrared (SWIR) optoelectronic devices having a dilute nitride active region having a non-uniform bandgap, operating within the wavelength range from 0.9 µm to 1.8 µm including photodetectors and photodetector arrays.

BACKGROUND

Optoelectronic devices operating in the infrared wavelength range between 0.9 µm and 1.8 µm range have a variety of applications, including fiber optic communications, sensing, and imaging. Traditionally, compound semiconductor materials are used to make such devices. Indium gallium arsenide (InGaAs) materials are usually grown on indium phosphide (InP) substrates. The composition and thickness of the InGaAs layers are chosen to provide a desired functionality, such as light emission or absorption at desired wavelengths of light and are also lattice-matched or very closely lattice-matched to the InP substrate to produce high quality materials that have low levels of crystalline defects, and high levels of performance.

With respect to photodetectors, devices that can be produced include high-speed photodetectors for telecommunications applications, and arrays of photodetectors that can be used as sensors and imagers for military, biomedical, industrial, environmental and scientific applications. In such applications, photodetectors with high responsivity, low dark current and low noise are desirable.

Although InGaAs on InP materials currently dominate the short wavelength infrared (SWIR) photodetector market, the material system has several limitations, including the high cost of InP substrates, low yields due to the fragility of the InP substrates, and limited InP wafer diameter (and associated quality issues at larger diameters). From a manufacturing perspective and also from an economic perspective, gallium arsenide (GaAs) represents a better substrate choice. However, the large lattice-mismatch between GaAs and the InGaAs alloys required for infrared devices produces poor quality materials that compromise electrical and optical performance. Attempts have been made to produce long-wavelength (greater than 1.2 µm) materials for photodetectors on GaAs substrates using dilute nitride materials such as GaInNAs and GaInNAsSb. However, where device performance is reported, it has been much poorer than for InGaAs/InP devices. For example, the dilute nitride-based devices have very low responsivity, which make the devices unsuited for practical sensing and photodetection applications. Furthermore, the dark currents for dilute nitride-based photodetectors can be higher than for other material systems, resulting in a higher noise level, which limits the minimum detectable optical power due to reduced signal-to-noise (SNR) ratio, and hence reduced detectivity.

For example, Cheah et al., "GaAs-Based Heterojunction p-i-n Photodetectors Using Pentenary InGaAsNSb as the Intrinsic Layer", *IEEE Photon. Technol. Letts.*, 17(9), pp. 1932-1934 (2005), and Loke et al., "Improvement of GaInNAs p-i-n photodetector responsivity by antimony incorporation", *J. Appl. Phys.* 101, 033122 (2007) report photodetectors having a responsivity of only 0.097 A/W at a wavelength of 1300 nm.

Tan et al., "GaInNAsSb/GaAs Photodiodes for Long Wavelength Applications," *IEEE Electron. Dev. Letts.*, 32(7), pp. 919-921 (2011) describe photodiodes having a responsivity of only 0.18 A/W at a wavelength of 1300 nm.

In U.S. Application Publication No. 2016/0372624, Yanka et al. disclose optoelectronic detectors having dilute nitride layers (InGaNAsSb). Although certain parameters that relate to semiconductor material quality are described, no working detectors having practical efficiencies are taught within the broad dilute nitride compositional ranges disclosed.

Thus, to take advantage of the manufacturing scalability and cost advantages of GaAs substrates, there is continued interest in developing long-wavelength materials on GaAs that have improved optoelectronic performance.

SUMMARY

According to the present invention, compound semiconductor optoelectronic structures comprises a substrate having a surface; a first doped region overlying the substrate surface; an active region overlying the first doped region, wherein the active region comprises: a dilute nitride material; and the active region has a bandgap that is non-uniform orthogonal to the substrate surface; and a second doped region overlying the active region.

According to the present invention, devices comprise a structure according to the present invention.

According to the present invention, methods of forming a semiconductor optoelectronic device comprise forming a first doped region overlying a substrate having a surface; forming an active region overlying the first doped region, wherein, the active region comprises a dilute nitride material; and the active region has a bandgap that is non-uniform orthogonal to the substrate surface; and forming a second doped region overlying the active region.

According to the present invention, semiconductor optoelectronic devices are fabricated using methods according to the present invention.

BRIEF DESCRIPTION OF THE DRAWINGS

The drawings described herein are for illustration purposes only. The drawings are not intended to limit the scope of the present disclosure.

DETAILED DESCRIPTION

Figure 1:
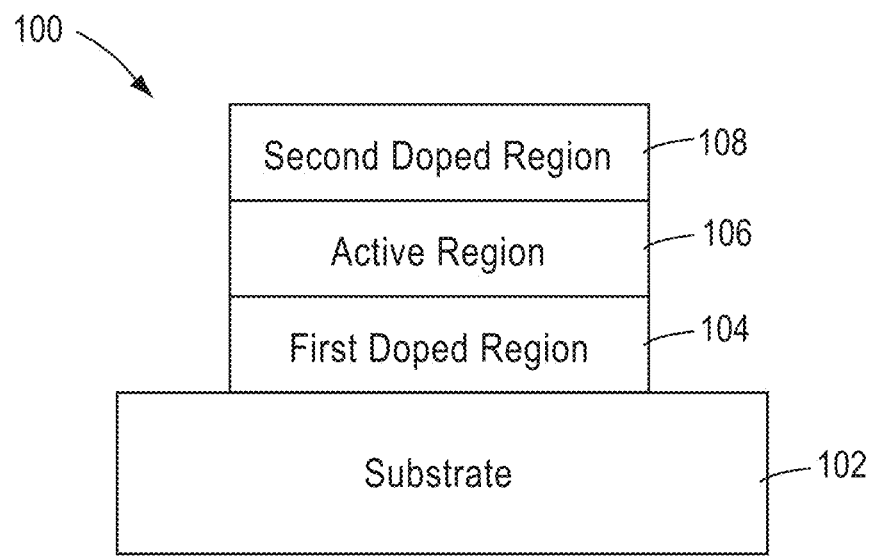
FIG. 1 shows a side view of an example of a semiconductor optoelectronic structure according to the present invention.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized, and structural, logical, and electrical changes may be made without departing from the scope of the invention. The various embodiments disclosed herein are not necessarily mutually exclusive, as some disclosed embodiments may be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

The term "lattice-matched" as used herein means that the two referenced materials have the same lattice constant or a lattice constant differing by less than +/−0.2%. For example, GaAs and AlAs are lattice-matched, having lattice constants differing by 0.12%.

The term "pseudomorphically strained" as used herein means that layers made of different materials with a lattice constant difference up to +/−2% can be grown on top of a lattice-matched or strained layer without generating misfit dislocations. The lattice parameters can differ, for example, by up to +/−1%, by up to +/−0.5%, or by up to +/−0.2%.

The term "active layer" as used herein, means a continuous region of a material (e.g., an alloy) that can be undoped, or uniformly. doped or non-uniformly doped and that can have a uniform or a non-uniform composition across the layer.

The term "active region" refers to a semiconductor region capable of processing light, which includes, for example, absorbing light, emitting light, and/or modulating light. An active region can comprise a single material layer or multiple material layers such as multiple active layers.

A "bandgap that varies continuously" refers to a bandgap that varies across the thickness of a region or layer and is not constant over a portion of the thickness.

A "bandgap that varies discontinuously" refers to a bandgap that varies across the thickness of a region or layer where there is a bandgap discontinuity or bandgap step.

A "bandgap that varies linearly" refers to a bandgap that varies across the thickness of a region or layer such that the bandgap=$a+b \times x$, where a is a first bandgap energy, b is a constant associated with a bandgap change and x is a position with respect to the thickness of the region or layer.

A "bandgap that varies quadratically" refers to a bandgap that varies across the thickness of a region or layer such that the bandgap=$a+b \times x^2$, where a is a first bandgap energy, b is a constant associated with a bandgap change and x is a position with respect to the thickness of the region or layer.

A "bandgap that varies polynomially", refers to a bandgap that varies across the thickness of a region or layer such that the bandgap=$a+b \times x^2$, where a is a first bandgap energy, b is a constant associated with a bandgap change, n is a positive integer and x is a position with respect to the thickness of the region or layer.

A "bandgap that varies as a square root" refers to a bandgap that varies across the thickness of a region or layer such that the bandgap=$a+b \times x^n$, where a is a first bandgap energy, b is a constant associated with a bandgap change and x is a position with respect to the thickness of the region or layer.

A "stepped bandgap" or a "discontinuous bandgap" refers to a bandgap that has at least one bandgap step or discontinuity across the thickness of a region or a layer such that the bandgap=$a+b \times H(x-x_0)$, where a is a first bandgap energy, b is a constant associated with a bandgap change, $H(x-x_0)$ is a step function such as a Heaviside step function, $x_0$ is a reference position within the thickness of the region or layer, and x is a position with respect to the reference position within the thickness of the region or layer.

A "bandgap that varies exponentially" refers to a bandgap that varies across the thickness of a region or layer such that the bandgap=$a+b \times e^x$, where a is a first bandgap energy, b is a constant associated with a bandgap change and x is a position with respect to the thickness of the region or layer.

A "constant doping profile" refers to a doping profile that is constant across the thickness of a region or layer.

A "continuous doping profile" refers to a doping profile that changes continuously across the thickness A "discontinuous doping profile" refers to a doping profile that is continuous in a portion of a region or layer and is constant in another portion of the region or layer.

The "diameter" of a device refers to a size of the device at the light-receiving surface. For example, referring to FIG. 4, the diameter of the device is the region between contacts 412 and covered by antireflection coating 416.

The "short wavelength cut-off" refers to the shortest wavelength of light that is absorbed in an active region and generates an electrical output, such as a current and/or a voltage.

The term "full width half maximum" (FWHM) refers to the wavelength range of a spectral response at which the amplitude is 50% the maximum amplitude.

"Orthogonal to the substrate surface" means perpendicular to the growth surface and in the thickness of the layer. For example, an active region that has a bandgap that varies orthogonal to the substrate surface has a bandgap that varies in the thickness direction of the active layer.

"Photoluminescence" can be determined by measuring the optical emission from a material or device that is subject to photon excitation in the material by an external light source, such as a laser. Laser light absorbed within the material or device causes photons to be emitted that are characteristic of the properties of the absorbing material. The responsivity can be determined by illuminating a device with a light source with known output light characteristics, such as a broad-band halogen lamp, with light monochromatized into narrow wavelength bands (such as 10 nm or 5 nm or 1 nm) and measuring the electrical current generated by the device.

The term "bandgap" as used herein is the energy difference between the conduction and valence bands of a material.

The term "responsivity" of a material as used herein is the ratio of the generated photocurrent to the incident light power at a given wavelength. The responsivity can be determined using a broad-band halogen lamp, with light monochromatized with 10 nm wavelength band.

"Room temperature" refers to a temperature from 23° C. to 25° C.

FIG. 1 shows a side view of an example of a semiconductor optoelectronic structure 100 according to the present invention. Device 100 comprises a substrate 102, a first doped region 104, an active region 106, and a second doped region 108. For simplicity, each region is shown as a single layer. However, it will be understood that each region can include one or more layers with differing compositions, thicknesses, and doping levels to provide an appropriate optical and/or electrical functionality, and to improve interface quality, electron transport, hole transport and/or other optoelectronic properties.

Substrate 102 can have a lattice constant that matches or nearly matches the lattice constant of GaAs or Ge. The substrate can be GaAs. Substrate 102 may be doped p-type, or n-type, or may be a semi-insulating (SI) substrate. The thickness of substrate 102 can be chosen to be any suitable thickness. Substrate 102 can include one or more layers, for example, the substrate can include a Si layer having an overlying SiGeSn buffer layer, a rare-earth containing layer, or a graded SiGe layer that is engineered to have a lattice constant that matches or nearly matches the lattice constant of GaAs or Ge.

First doped region 104 can have a doping of one type and the second doped region 108 can have a doping of the opposite type. If first doped region 104 is doped n-type, second doped region 108 is doped p-type. Conversely, if first doped region 104 is doped p-type, second doped region 108 is doped n-type. Examples of p-type dopants include C and Be. Examples of n-type dopants include Si and Te. Doped regions 104 and 108 are chosen to have a composition that is lattice-matched or pseudomorphically strained with respect to the substrate. The doped regions can comprise any suitable III-V material, such as GaAs, AlGaAs, GaInAs, (Al)GaInP, (Al)GaInPAs, GaInNAs, and/or GaInNAsSb. The bandgap of the doped regions can independently be selected to be larger than the bandgap of active region 106. Doping levels of each of the doped regions can independently be within a range, for example, from $1 \times 10^{15}$ cm$^{-3}$ to $2 \times 10^{19}$ cm$^{-3}$, from $1 \times 10^{16}$ cm$^{-3}$ to $2 \times 10^{18}$ cm$^{-3}$, $2 \times 10^{16}$ cm$^{-3}$, to $1 \times 10^{18}$ cm$^{-3}$, or from $1 \times 10^{17}$ cm$^{-3}$ to $1 \times 10^{19}$ cm$^{-3}$. Doping levels may be constant within a doped region, and/or the doping profile may be graded within a doped region, for example, the doping level can increase from a minimum value to a maximum value as a function of the distance from the interface between the first doped region 104 and the active region 106 and/or from the interface between the second doped region 108 and the active region 106. Doped regions 104 and 108 can independently have a thickness within a range, for example, from 50 nm to 3 μm, from 100 nm to 2.5 μm, from 200 nm to 2 μm, or from 500 nm to 1.5 μm.

Active region 106 can be lattice-matched or pseudomorphically strained with respect to the substrate and/or to the doped regions. The maximum bandgap of active region 106 can independently be less than that of the doped regions 104 and 108. For example, the maximum bandgap of active region 106 can be at least 25 meV less than the bandgap of each of doped regions 104 and 108, at least 100 meV less, at least 200 meV less, at least 400 meV less, at least 600 meV less, at least 800 meV less, or at least 1,000 meV less than the bandgap of each of doped regions 104 and 108. The bandgap of each of doped region 104 and 108 can be, for example, from 25 meV to 1,000 meV greater than the maximum bandgap of the active region 106, from 50 meV to 800 meV, from 100 meV to 600 meV, or from 200 meV to 500 meV greater than the bandgap of the active region 106. The bandgap of each of doped regions 104 and 108 can be, for example, about 1.4 eV for GaAs materials or at least 1.4 for materials such as InGaP, InGaAlP and InGaAlPAs.

Active region 106 can comprise a region capable of processing light over a desired wavelength range. Processing light includes, for example, emitting light, receiving light, sensing light, and/or modulating light.

Active region 106 can include a dilute nitride material. A dilute nitride material can be $Ga_{1-x}In_xN_yAs_{1-y-z}Sb_z$, where x, y and z can be $0 \leq x \leq 0.4$, $0 < y \leq 0.07$ and $0 < z \leq 0.04$, respectively. X, y and z can be $0.01 \leq x \leq 0.4$, $0.02 \leq y \leq 0.07$ and $0.001 \leq z \leq 0.04$, respectively. In other embodiments, dilute nitride materials can have compositions as disclosed in U.S. Pat. No. 8,962,993, where x, y and z can be $0 \leq x \leq 0.24$, $0.02 \leq y \leq 0.05$ and $0.001 \leq z \leq 0.2$, respectively. A dilute nitride material can be $Ga_{1-x}In_xN_yAs_{1-y-z}Sb_z$, where, for example, $0.12 \leq x \leq 0.24$, $0.03 \leq y \leq 0.07$ and $0.005 \leq z \leq 0.04$; $0.13 \leq x \leq 0.2$, $0.03 \leq y \leq 0.045$ and $0.001 \leq z \leq 0.02$; $0.13 \leq x \leq 0.18$, $0.03 \leq y \leq 0.04$ and $0.001 \leq z \leq 0.02$; or $0.18 \leq x \leq 0.24$, $0.04 \leq y \leq 0.07$ and $0.01 \leq z \leq 0.024$. Active region 106 can have a bandgap within a range from 0.7 eV and 1.3 eV such that the active region can absorb or emit light at wavelengths up to 1.8 μm. Bismuth (Bi) may be added as a surfactant during growth of the dilute nitride material, improving material quality (such as defect density), and the device performance.

The thickness of active region 106 can be within a range, for example, from 0.2 μm to 10 μm. The thickness of active region 106 can be within a range, for example, from 0.5 μm to 5 μm. The thickness of active region 106 can be within a range, for example, from 1 μm to 4 μm, from 1 μm to 3 μm, or from 1 μm to 2 μm. Active region 106 can be compressively strained with respect to the substrate 102. Strain can improve device performance. For a photodetector, the parameters most relevant to device performance include the dark current, operating speed, noise, and responsivity.

In FIG. 1, active region 106 is shown as a single active layer, but it will be understood that active region 106 can include more than one active layers with each of the active layers comprising a dilute nitride material, and with each of the active layers independently having a bandgap within a range from 0.7 eV and 1.4 eV. In some examples, active region 106 can include a single active layer with different portions of the active region having different doping profiles. Examples of doping profiles for dilute nitride optical absorber materials are described in U.S. Application Publication No. 2016/0118526, which is incorporated by reference in its entirety.

Active region 106 and doped regions 104 and 108 can form a p-i-n or an n-i-p junction. This junction provides the basic structure for operation of a device such as a photodetector or a light-emitting diode. For photodetectors, p-i-n epitaxial structures can have low background doping in the intrinsic region (active region) of the devices which are typically operated at 0 V or at very low bias. Therefore, the active region 106 may not be deliberately doped. The active region can be intrinsic or can be unintentionally doped. Unintentionally doped semiconductors do not have dopants intentionally added but can include a nonzero concentration of impurities that act as dopants. The background carrier concentration of the intrinsic or unintentionally doped active region, which is equivalent to the dopant concentration, can be, for example, less than $1\times10^{16}$ cm$^{-3}$ (measured at room temperature (25° C.), less than $5\times10^{15}$ cm$^{-3}$, or less than $1\times10^{15}$ cm$^{-3}$. The minority carrier lifetime within the active region can be, for example, greater than 1 ns, greater than 1.5 ns, or greater 2 ns. The minority carrier lifetime can be affected by defects within the semiconductor that contribute to the background carrier concentration, as well as other defect types that can act as recombination centers but do not contribute carriers.

Figure 2:
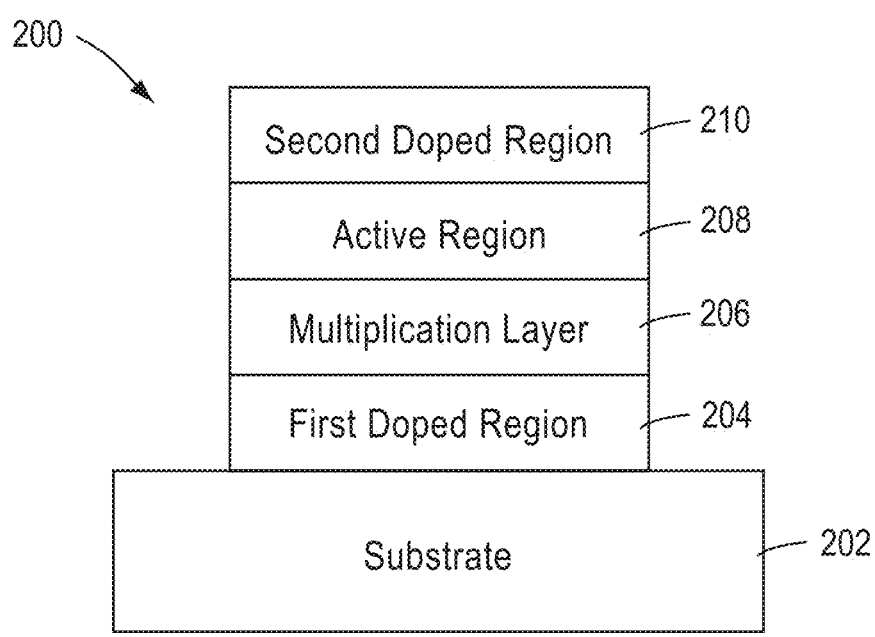
FIG. 2 shows a side view of another example of a semiconductor optoelectronic structure according to the present invention.

FIG. 2 shows a semiconductor optoelectronic structure 200 with a p-i-n diode and a multiplication layer 206. Structure 200 is similar to structure 100, but also includes a multiplication layer. The purpose of the multiplication layer 206 is to amplify the photocurrent generated by the active region 208 of a photodetector device. Optoelectronic structure 200 can provide an avalanche photodiode (APD). An APD introduces an additional p-n junction into the structure, as well as introduces an additional thickness. This allows a higher reverse bias voltage to be applied to the structure, which results in carrier multiplication by the avalanche process.

Substrate 202 can have a lattice constant that matches or nearly matches the lattice constant of GaAs or Ge. The substrate can be GaAs. Substrate 202 may be doped p-type, or n-type, or may be a semi-insulating (SI) substrate. The thickness of substrate 202 can be chosen to be any suitable thickness. Substrate 202 can include one or more layers, for example, a Si layer having an overlying SiGeSn buffer layer that is engineered to have a lattice constant that matches or nearly matches the lattice constant of GaAs or Ge. This can mean the substrate has a lattice parameter different than that of GaAs or Ge by less than or equal to 3%, less than 1%, or less than 0.5% that of GaAs or Ge.

First doped region 204 can have a doping of one type and the second doped region 210 can have a doping of the opposite type. If first doped region 204 is doped n-type, second doped region 210 is doped p-type. Conversely, if first doped region 204 is doped p-type, second doped region 210 is doped n-type. Examples of p-type dopants include C and Be. Examples of n-type dopants include Si and Te. Doped regions 204 and 210 can independently be chosen to have a composition that is lattice-matched or pseudomorphically strained with respect to the substrate. The doped regions can comprise any suitable III-V material, such as GaAs, AlGaAs, GaInAs, (Al)GaInP, (Al)GaInPAs, AlInP, GaInNAs, and GaInNAsSb. The bandgap of the doped regions can be independently selected to be larger than the bandgap of active region 208. Doping levels can be within a range, for example, from $1\times10^{15}$ cm$^{-3}$ to $2\times10^{19}$ cm$^{-3}$, from $1\times10^{16}$ cm$^{-3}$ to $2\times10^{18}$ cm$^{-3}$, $2\times10^{16}$ cm$^{-3}$ to $1\times10^{18}$ cm$^{-3}$, or from $1\times10^{17}$ cm$^{-3}$ to $1\times10^{19}$ cm$^{-3}$. Doping levels may be constant within a layer and/or the doping profile may be graded, for example, the doping level can increase from a minimum value to a maximum value as a function of the distance from the interface between the second doped region 210 and the active region 208 or from the interface between the first doped region 204 and the active region 206. Doped regions 204 and 210 can have a thickness, for example, within a range from 50 nm and 3 μm, from 100 nm to 2.5 μm, from 200 nm to 2 μm, or from 500 nm to 1.5 μm.

Active region 208 can be lattice-matched or pseudomorphically strained with respect to the substrate and/or to the doped regions. The maximum bandgap of active region 208 can be lower than that of the doped regions 204 and 210. Active region 208 can comprise a layer capable of processing light over a desired wavelength range.

Active region 208 can include a dilute nitride material. The dilute nitride material can be $Ga_{1-x}In_xN_yAs_{1-y-z}Sb_z$, where x, y and z can be $0 \le x \le 0.4$, $0 < y \le 0.07$ and $0 < z \le 0.04$, respectively. X, y and z can be $0.01 \le x \le 0.4$, $0.02 \le y \le 0.07$ and $0.001 \le z \le 0.04$, respectively. In other embodiments, dilute nitride materials can have compositions as disclosed in U.S. Pat. No. 8,962,993, where x, y and z can be $0 \le x \le 0.24$, $0.02 \le y \le 0.05$ and $0.001 \le z \le 0.2$, respectively. A dilute nitride material can be $Ga_{1-x}In_xN_yAs_{1-y-z}Sb_z$, where, for example, $0.12 \le x \le 0.24$, $0.03 \le y \le 0.07$ and $0.005 \le z \le 0.04$; $0.13 \le x \le 0.20$, $0.03 \le y \le 0.045$ and $0.001 \le z \le 0.02$; $0.13 \le x \le 0.18$, $0.03 \le y \le 0.04$ and $0.001 \le z \le 0.02$; or $0.18 \le x \le 0.24$, $0.04 \le y \le 0.07$ and $0.01 \le z \le 0.04$. Active region 208 can have a bandgap within a range from 0.7 eV to 1.3 eV such that the active region can absorb or emit light at wavelengths up to 1.8 μm. Bismuth (Bi) may be added as a surfactant during growth of the dilute nitride, improving material quality (such as defect density), and the device performance. The thickness of active region 208 can be within a range, for example, from 0.2 μm to 10 μm, from 0.5 μm to 5 μm, or from 1 μm to 4 μm. Active region 208 can be compressively strained with respect to the substrate 202. Strain can also improve device performance. For a photodetector, the device performance of most relevance includes the dark current, operating speed, noise and responsivity.

In FIG. 2, active region 208 is shown as a single layer, but it will be understood that active region 208 can include more than one active layers and each active layer can comprise a dilute nitride material which can independently have a bandgap within a range from 0.7 eV and 1.4 eV, as will be described later. In some examples, active region 208 can include regions with different doping profiles. Examples of doping profiles for dilute nitride optical absorber materials are described in U.S. Application Publication No. 2016/0118526, which is incorporated by reference in its entirety.

An active region can comprise a single active layer. In a single layer-active region the composition of the material forming the single-layer active region can be uniform throughout the single-layer active region or can vary continuously across the single layer-active region. An active region can comprise two or more active layers and can be referred to as a multilayer active region. Each of the two or more layers of a multilayer active region can have a different material composition. In a multilayer active region, the composition can vary discretely across the thickness of the multilayer active region. This can be compared to a single layer active region where the composition can vary continuously across the thickness of the single layer-active region.

A multilayer active region can comprise one or more active layers where the material composition forming the one or more active layers varies continuously across the active layer and one or more active layers where the material composition is uniform across the active layer.

The multiplication layer 206 can be a p-type III-V layer configured to amplify the current generated by the active region 208 through avalanche multiplication. Thus, for each free carrier (electron or hole) generated by the active region 208, the multiplication layer 206 generates one or more carriers via the avalanche effect. Thus, the multiplication layer 206 can increase the total current generated by the semiconductor 200. Multiplication layer 206 can comprise a III-V material, such as GaAs or AlGaAs. In some embodiments, multiplication layer 206 can include a dilute nitride material such as GaInNAs, GaInNAsSb or GaNAsSb. Examples of semiconductor materials and structures for multiplication layers are described in PCT International Publication No. WO 2019/241450, which is incorporated by reference in its entirety.

Figure 3:
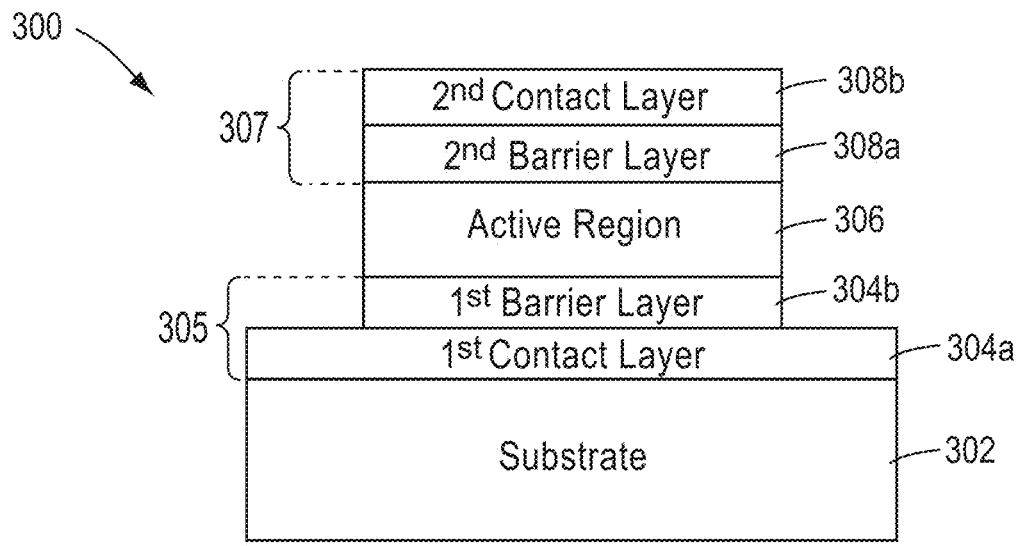
FIG. 3 shows a side view of another example of a semiconductor optoelectronic structure according to the present invention.

FIG. 3 shows a side view of an example of a semiconductor optoelectronic structure 300 according to the present invention. Structure 300 is similar to structure 100, but each of the doped regions is shown to comprise two layers consisting of a contact layer and a barrier layer. Device 300 includes a substrate 302, a first contact layer 304a, a first barrier layer 304b, an active region 306, a second barrier layer 308a, and a second contact layer 308b.

Substrate 302 can have a lattice constant that matches or nearly matches the lattice constant of GaAs or Ge. The substrate can be GaAs. Substrate 302 may be doped p-type, or n-type, or may be a semi-insulating (SI substrate). The thickness of substrate 302 can be any suitable thickness. Substrate 302 can include one or more layers, for example, substrate 302 can include a Si layer having an overlying SiGeSn buffer layer that is engineered to have a lattice constant that matches or nearly matches the lattice constant of GaAs or Ge. This can mean that the substrate can have a lattice parameter different than that of GaAs or Ge by less than or equal to 3%, less than 1%, or less than 0.5% that of GaAs or Ge.

First contact layer 304a and first barrier layer 304b provide a first doped region 305, having a doping of one type, and second barrier layer 308a and second contact layer 308b provide a second doped region 307, having a doping of the opposite type. If first doped region 305 is doped n-type, second doped region 307 is doped p-type. Conversely, if first doped region 305 is doped p-type, second doped region 307 is doped n-type. Examples of p-type dopants include C and Be. Examples of n-type dopants include Si and Te. Doped regions 305 and 307 can be chosen to have a composition that is lattice-matched or pseudomorphically strained with respect to the substrate. The doped regions can comprise any suitable III-V material, such as GaAs, AlGaAs, GaInAs, (Al)GaInP, (Al)GaInPAs, AlInP, GaInNAs, and GaInNAsSb. The contact and barrier layers can have different compositions and different thicknesses. The bandgap of the doped regions can be selected to be larger than the bandgap of active region 306. The doping level of first contact layer 304a can be chosen to be higher than the doping level of first barrier layer 304b. A higher doping level facilitates electrical connection with a metal contact. Similarly, the doping level of second contact layer 304b can be chosen to be higher than the doping level of second barrier layer 304a. Higher doping levels facilitate electrical connection with a metal contact. Doping levels for the contact layers and for the barrier layers can independently be within a range, for example, from $1\times10^{15}$ cm$^{-3}$ to $2\times10^{19}$ cm$^{-3}$, from $1\times10^{16}$ cm$^{-3}$ to $2\times10^{18}$ cm$^{-3}$, $2\times10^{16}$ cm$^{-3}$ to $1\times10^{18}$ cm$^{-3}$, or from $1\times10^{17}$ cm$^{-3}$ to $1\times10^{19}$ cm$^{-3}$. Doping levels may be constant within a layer and/or the doping profile may be graded, for example, the doping level can increase from a minimum value to a maximum value as a function of the distance from the interface between the doped layer 308a and the active region 306. Each of barrier and contact layers 304a, 304b, 308a and 308b can independently have a thickness, for example, within a range from 50 nm to 3 µm, from 100 nm to 2.5 µm, from 200 nm to 2 µm, or from 500 nm to 1.5 µm.

Active region 306 can be lattice-matched or pseudomorphically strained with respect to the substrate and/or to the barrier layers. The maximum bandgap of active region 306 can be lower than that of each of barrier and contact layers 304a, 304b, 308a and 308b. For example, the maximum bandgap of active region can be at least 25 meV less than the minimum bandgap of each of the barrier and contact layers, at least 50 meV, at least 100 meV, at least 200 meV less, at least 300 meV less, at least 400 meV less, or at least 500 mV less than the minimum bandgap of each of the barrier and contact layer. The maximum bandgap of active region 306 can independently be from 25 meV to 1,000 meV less than the minimum bandgap of each of the barrier and contact layers, from 50 meV to 800 mV, from 100 meV to 600 meV, or from 200 meV to 0.500 mV less than the minimum bandgap of each of the barrier and contact layers.

Active region 306 can include a dilute nitride material. The dilute nitride material can be $Ga_{1-x}In_xN_yAs_{1-y-z}Sb_z$, where x, y and z can be $0 \leq x \leq 0.4$, $0 < y \leq 0.07$ and $0 < z \leq 0.04$, respectively. X, y and z can be $0.01 \leq x \leq 0.4$, $0.02 \leq y \leq 0.07$ and $0.001 \leq z \leq 0.04$, respectively. In other embodiments, a dilute nitride material can have composition as disclosed in U.S. Pat. No. 8,962,993, where x, y and z can be $0 \leq x \leq 0.24$, $0.02 \leq y \leq 0.05$ and $0.001 \leq z \leq 0.2$, respectively. A dilute nitride material can be $Ga_{1-x}In_xN_yAs_{1-y-z}Sb_z$, where, for example, $0.12 \leq x \leq 0.24$, $0.03 \leq y \leq 0.07$ and $0.005 \leq z \leq 0.04$; $0.13 \leq x \leq 0.2$, $0.03 \leq y \leq 0.045$ and $0.001 \leq z \leq 0.02$; $0.13 \leq x \leq 0.18$, $0.03 \leq y \leq 0.04$ and $0.001 \leq z \leq 0.02$; or $0.18 \leq x \leq 0.24$, $0.04 \leq y \leq 0.07$ and $0.01 \leq z \leq 0.04$.

Active region 306 can have a bandgap within a range from 0.7 eV to 1.3 eV such that the active region can absorb or emit light at wavelengths up to 1.8 µm. Bismuth (Bi) may be added as a surfactant during growth of the dilute nitride, improving material quality (such as defect density), and the device performance. The thickness of active region 306 can be, for example, within a range from 0.2 µm to 10 µm, from 0.5 µm to 8 µm, from 1.0 µm to 6 µm, from 1.0 µm to 5 µm, from 1 µm to 4 µm, from 1 µm to 3 µm, or from 1 µm to 2 µm. The carrier concentration of the active region can be, for example, less than $1\times10^{16}$ cm$^{-3}$ (measured at room temperature (25° C.), less than $5\times10^{15}$ cm$^{-3}$, or less than $1\times10^{15}$ cm$^{-3}$. Active region 306 can be compressively strained with respect to the substrate 302. Strain can also improve device performance. For a photodetector, the parameters most relevant to device performance include the dark current, operating speed, noise and responsivity.

Active region 306 is shown as a single layer, but it will be understood that active region 306 can include at more than one active layer with each active layer having a different bandgap. For example, each active layer can independently have a bandgap within a range from 0.7 eV and 1.4 eV. An active region can comprise, for example, from 2 to 10 active layers, from 2 to 9 active layers, from 2 to 8 active layers, from 2 to 7 active layers, from 2 to 6 active layers, from 2 to 5 active layers, from 2 to 4 active layers or from 2 to 3 active layers. Each of the active layers can have a bandgap that is different from each of the other active layers. At least some of the active layers can have a bandgap that is different than that of other active layers. In an active layer, the elemental composition of the material forming the active layer such as a dilute nitride material, such as Ga$_{1-x}$In$_x$N$_y$As$_{1-y-z}$Sb$_z$, can have a substantially uniform composition throughout the in-plane dimension and in the growth dimension. For example, a substantially uniform composition can be substantially uniform elemental composition. For example, in a substantially uniform elemental composition the content of each element can differ by less than 1%, by less than 2%, or by less than 5%.

Each active layer forming an active region can independently have a uniform bandgap. For example, in an active layer having a uniform bandgap the bandgap throughout the in-plane dimension and in the growth dimension can differ, for example, by less than 0.010 eV, by less than 0.015 eV, or by less than 0.02 eV.

An active region can comprise one or more active layers having a doping profile. A doping profile can vary across the growth direction of the active layer. An active layer can comprise, for example, a linear doping profile, a non-linear doping profile, an exponential doping profile, or a combination of any of the foregoing. An active layer can comprise a constant doping profile. An active layer can comprise a portion having intrinsic doping. An active layer can comprise portions in the growth dimension that are intrinsically doped, intentionally doped, or a combination thereof. An active layer can comprise a portion that is intrinsically doped, a portion that has a constant doping profile, a portion that has a linear doping profile, a portion that has a non-linear doping profile, or a combination of any of the foregoing. An active layer and/or a portion of an active layer can be p-doped or n-doped.

An active region 306 can include regions with different doping profiles. Examples of doping profiles for dilute nitride materials are described in U.S. Application Publication No. 2016/0118526, which is incorporated by reference in its entirety.

An active region can have a non-uniform composition in the thickness dimension. For example, the elemental composition of the active region can vary linearly or non-linearly across that thickness of the active region. The elemental composition of the active region can vary linearly or non-linearly across a portion of the thickness of the active region. Non-limiting examples of non-linear monotonically-varying profiles include quadratic profiles, polynomial profiles, square root profiles and exponential profiles, as well as discontinuous profiles with compositional steps. For example, in a non-uniform composition the content of at least one element can vary by greater than 5%, greater than 10%, greater than 15% or greater than 20%, across the active region.

A non-uniform active region can have a bandgap that varies across the thickness dimension. The bandgap can vary linearly or non-linearly such as quadratically or exponentially. The bandgap can vary, for example, by at least 40 meV across the thickness of the non-uniform active region, by at least 60 meV, by at least 100 meV, by at least 200 meV, by at least 400 meV, by at least 600 meV, or by at least 800 meV. The bandgap can vary, for example, by from 40 meV to 1,000 meV, from 40 meV to 700 meV, or by from 40 meV to 400 meV.

Figure 4:
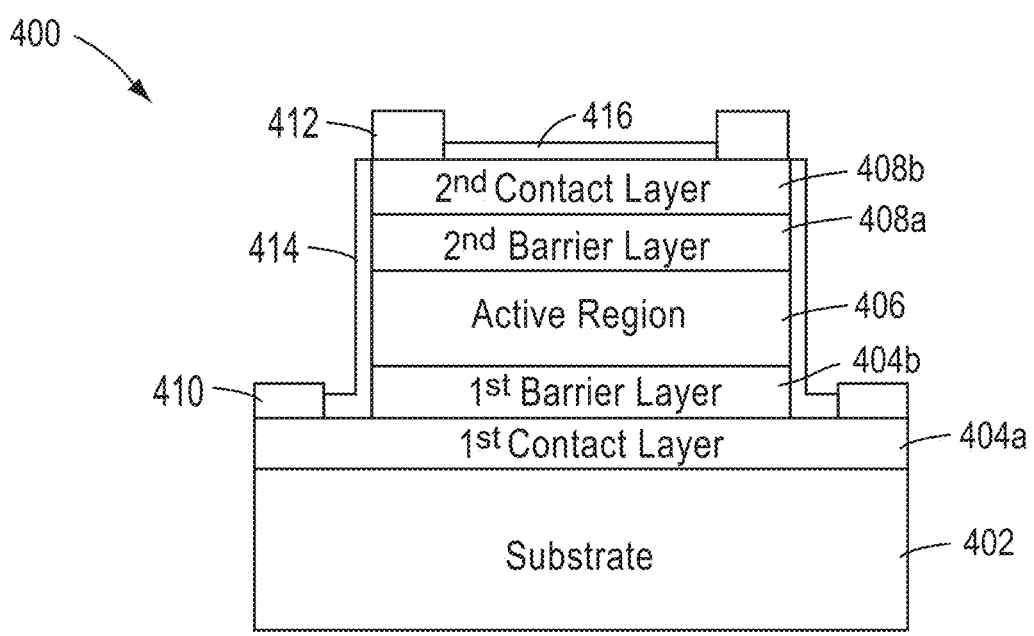
FIG. 4 shows a side view of an example of a photodetector according to the present invention.

FIG. 4. shows a side view of an example of a photodetector 400 according to the present invention. Device 400 is similar to device 300. Compared to device 300, additional device layers include a first metal contact 410, a second metal contact 412, a passivation layer 414, and an antireflection coating 416. The semiconductor layers 402, 404*a*, 404*b*, 406, 408*a* and 408*b* correspond to layers 302, 304*a*, 304*b*, 306, 308*a* and 308*b*, respectively, of device 300. Multiple lithography and materials deposition steps may be used to form the metal contacts, passivation layer, and antireflection coating. The device has a mesa structure, produced by etching. This exposes the underlying layers. A passivation layer 414 is provided that covers the side-walls of the device and the exposed surfaces of the layers so as to reduce surface defects and dangling bonds that may otherwise affect device performance. The passivation layer can be formed using a dielectric material such as silicon nitride, silicon oxide, or titanium oxide. Anti-reflection layer 416 overlies a first portion of second contact layer 408*a*. The antireflection layer can be formed using a dielectric material such as silicon nitride, silicon oxide, and titanium oxide. A first metal contact 410 overlies a portion of the first contact layer 404*a*. A second metal contact 412 overlies a second portion of second contact layer 408*b*. Metallization schemes for contacting to n-doped and p-doped materials are known. Photodetector 400 can be illuminated from the top surface of the device, i.e. through the interface between anti-reflection coating 416 and air. A photodetector may be illuminated via the bottom surface, i.e. the interface between the lower surface of the substrate 402 and air. The bottom surface of the substrate may be coated with an anti-reflection coating. Incident optical radiation on a detector will generate an electronic signal at the detector.

Figure 5A:
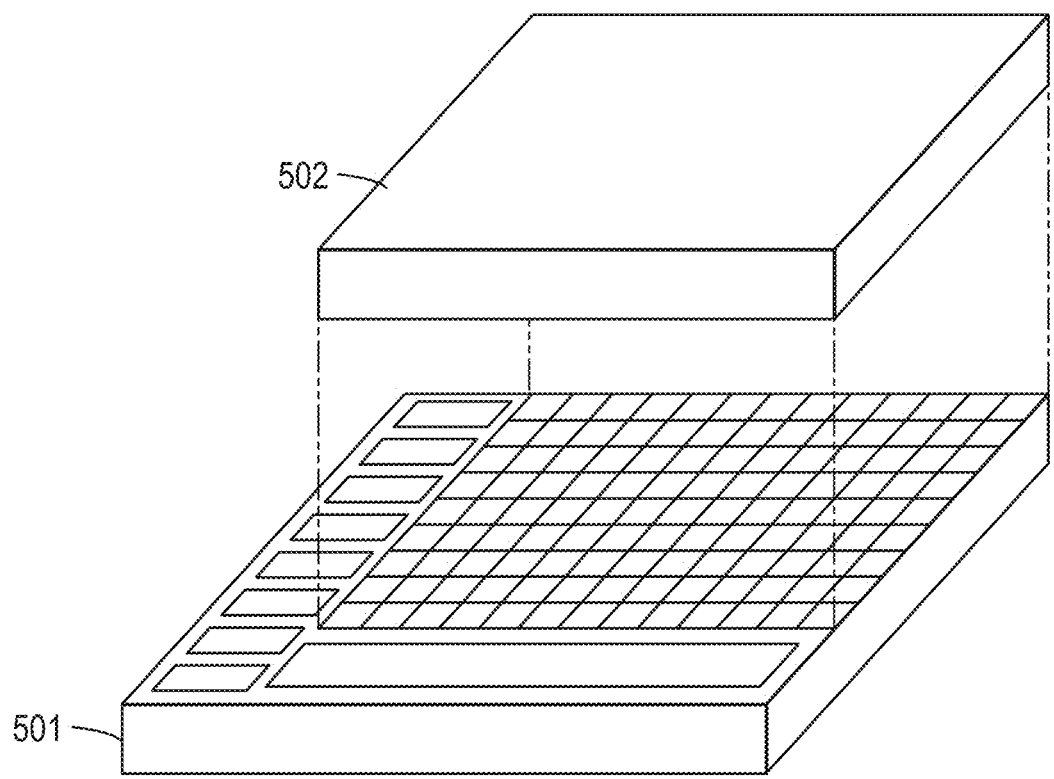
FIGS. 5A and 5B are diagrams showing hybrid integration of a detector array chip with an array of readout circuits on a readout integrated circuit (ROIC) chip
Figure 5B:
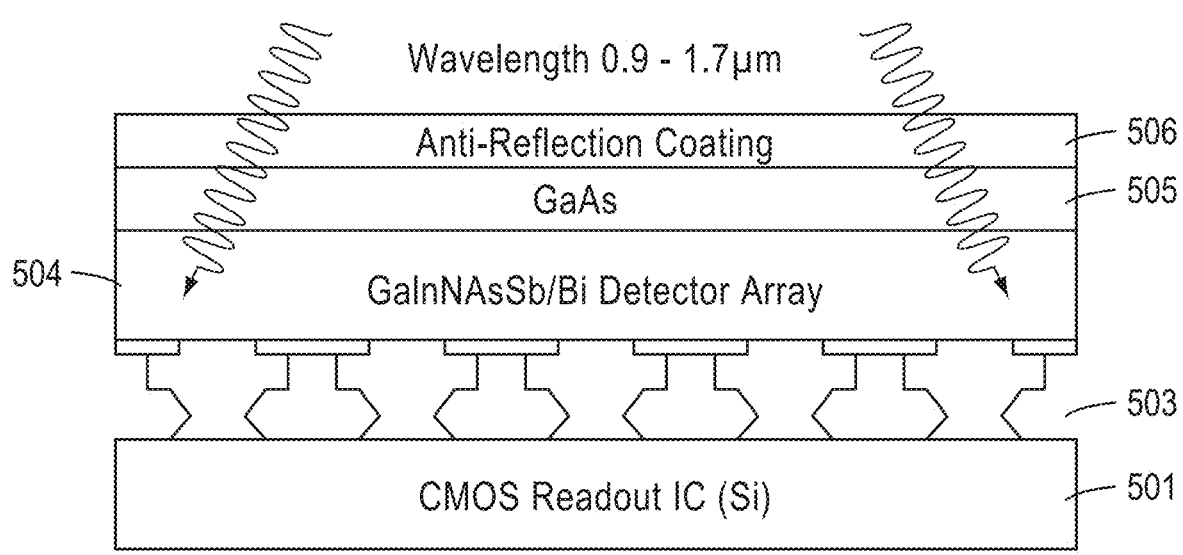

For an array of detectors, the collected signals may be amplified by a readout integrated circuit (ROIC) comprising a transistor or a trans-impedance amplifier to form a Focal Plane Array (FPA). Examples of photodetector arrays are shown in FIGS. 5A and 5B. FIG. 5A shows a perspective view of a photodetector array including CMOS readout IC 501, and photodetector array 502. FIG. 5B shows a cross-sectional view of CMOS readout IC 501 interconnected to photodetector array 502 through interconnects 503. Photodetector array 502 includes an array of photodetectors provided by the present invention 504, a conversion layer 505, and an antireflection coating 506.

To fabricate optoelectronic devices provided by the present disclosure, a plurality of layers can be deposited on a substrate in a materials deposition chamber. The plurality of layers may include active regions, doped regions, contact layers, etch stop layers, release layers (i.e., layers designed to release the semiconductor layers from the substrate when a specific process sequence, such as chemical etching, is applied), buffer layers, or other semiconductor layers.

The plurality of layers can be deposited, for example, by molecular beam epitaxy (MBE) or by metal-organic chemical vapor deposition (MOCVD). Combinations of deposition methods may also be used.

A semiconductor optoelectronic device can be subjected to one or more thermal annealing treatments after growth. For example, a thermal annealing treatment can include the application of a temperature of 400° C. to 1,000° C. for from 10 seconds to 10 hours. Thermal annealing may be performed in an atmosphere that includes air, nitrogen, arsenic, arsine, phosphorus, phosphine, hydrogen, forming gas, oxygen, helium and any combination of the preceding materials.

Devices provided by the present disclosure can comprise a GaInNAsSb active region overlying a GaAs substrate. The GaInNAsSb layer can be compressively strained with respect to the GaAs substrate. For example, the XRD peak slitting between the GaInNAsSb peak and the GaAs substrate peak can be, for example, from 300 arcsecs to 1,000 arcsecs, from 600 arcsecs to 800 arcsecs, or from 650 arcsecs to 750 arcsecs. An XRD splitting from 600 arcsecs to 1,000 arcsecs, corresponds to a compressive strain from 0.2% to 0.35%.

A dilute nitride layer or dilute-nitride active region such as a GaInNAsSb active layer or GaInNAsSb active region can have an intrinsic or unintentional doping equivalent to a doping concentration, for example, less than $1 \times 10^{16}$ cm$^{-3}$, less than $5 \times 10^{15}$ cm$^{-3}$, or less than $1 \times 10^{15}$ cm$^{-3}$, measured at room temperature (25° C.). A dilute nitride active layer or dilute nitride active region such as a GaInNAsSb active layer or GaInNAsSb active region can have an intrinsic or unintentional doping equivalent to a doping concentration, for example, from $0.5 \times 10^{14}$ cm$^{-3}$ to $1 \times 10^{16}$ cm$^{-3}$ or from $1 \times 10^{15}$ cm$^{-3}$ to $5 \times 10^{15}$ cm$^{-3}$, measured at room temperature (25° C.).

A dilute nitride active layer or dilute nitride active region such as a GaInNAsSb active layer or GaInNAsSb active region can have a minority carrier lifetime, for example, from 1.0 ns to 3.0 ns, from 1.5 ns to 2.5 ns, or from 1.5 ns to 2.0 ns. A dilute nitride active layer or dilute nitride active region such as a GaInNAsSb active layer or GaInNAsSb active region can have a minority carrier lifetime, for example, greater than 1.0 ns, greater than 1.5 ns, greater than 2.0 ns, or greater than 2.5 ns. The TRPL kinetics are measured at room temperature (approximately 25° C.), using an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

A dilute nitride active layer or dilute nitride active region such as a GaInNAsSb active layer or GaInNAsSb active region can have a bandgap, for example, from 0.9 eV to 0.92 eV.

A dilute nitride active layer or dilute nitride active region such as a GaInNAsSb active layer or GaInNAsSb active region can have photoluminescence spectrum having a FWHM, for example, from 50 nm to 150 nm, from 50 nm to 125 nm, from 50 nm to 70 nm, or from 75 nm to 125 nm, as determined by photoluminescence spectroscopy.

The dilute nitride active layer or dilute nitride active region such as a GaInNAsSb active layer or GaInNAsSb active region can have a thickness, for example, from 0.25 µm to 2.5 µm, from 0.5 µm to 2.0 µam, or from 0.5 µm to 1.5 µm.

A device provided by the present disclosure, such as a photodetector, can have the structure of FIG. 4.

A device such as a photodetector provided by the present disclosure can have a diameter, for example, from 20 µm to 3 mm, from 0.5 mm to 2.5 mm, or from 1 mm to 2 mm, where diameter refers to the in-plane width of the active region of the device. For example, referring to FIG. 4 the diameter refers to the distance between contacts 412. A device such as a photodetector can have a diameter, for example, greater than 20 µm, greater than 100 µm, greater than 500 µm, greater than 1 mm, or greater than 2 mm, where diameter refers to the in-plane width of the active region of the device.

A device such as a photodetector provided by the present disclosure can have sidewall angles between about 70° and 90° (perpendicular to the substrate) such as between about 80° and 90°, where the sidewall angles refer to the angles of the sidewalls of the stacked epitaxial layers with respect to the plane of the surface of the substrate.

A device such as a photodetector provided by the present disclosure can have a responsivity within a range, for example, from 0.55 A/W to 0.90 A/W, 0.6 A/W to 0.85 A/W, from 0.65 A/W to 0.80 A/W at a wavelength of 1300 nm, where responsivity is measured using a broad-band halogen lamp, with light monochromatized with 10 nm wavelength band.

A device such as a photodetector provided by the present disclosure can have a diameter from 0.75 mm to 1.25 mm such as from 0.9 mm to 1.1 mm, and can exhibit a dark current, for example, from 2.5 nA to 4.5 nA, from 2.7 nA to 4.3 nA, from 2.9 nA to 4.1 nA, from 3.1 nA to 3.9 nA, or from 3.2 nA to 3.8 nA, at a bias voltage of 1V, measured at room temperature (25° C.).

A photodetector provided by the present disclosure having a dilute nitride active region can have the structure shown in FIG. 4. The substrate can be a semi-insulating GaAs substrate, the first barrier layer can be a p-doped GaAs layer having a thickness from 0.05 µm to 0.15 µm and a doping level from $1 \times 10^{17}$ cm$^{-3}$ to $1 \times 10^{19}$ cm$^{-3}$, the second barrier layer can be an n-doped GaAs layer having a thickness from 0.05 µm to 0.15 µm and a doping level from $1 \times 10^{17}$ cm$^{-3}$ to $1 \times 10^{19}$ cm$^{-3}$, and the active region can comprise a GaInNAsSb material having a bandgap from 0.9 eV to 0.92 eV, a photoluminescence spectrum having a FWHM from 50 nm to 70 nm, and a thickness from 0.05 µm to 0.15 µm. The XRD splitting between the GaInNAsSb peak and the GaAs substrate can be from 600 arcsecs to 1000 arcsecs corresponding to a compressive strain of 0.2% to 0.35%.

A photodetector provided by the present disclosure can have the structure of FIG. 4, a diameter from 0.75 mm to 1.25 mm, sidewall angles from 70° and 90° (perpendicular to the substrate), a responsivity within a range from 0.6 A/W to 0.85 A/W (at a wavelength of 1300 nm) measured using a broad-band halogen lamp, with light monochromatized with a 10 nm wavelength band, and a dark current from 2.5 nA to 4.5 nA.at a bias voltage of 1V, measured at room temperature (25° C.).

Reduced dark currents may be achieved in devices where the dilute nitride active layer or region has at least two bandgaps associated with different elemental compositions of the dilute nitride material within the active layer or region. The active region can be characterized by a maximum bandgap difference, which refers to the difference between the highest bandgap and the lowest bandgap material within the active region. In a dilute nitride active region, the difference between the highest bandgap of the dilute nitride material and the lowest bandgap of the dilute nitride material is the maximum bandgap difference. A bandgap difference of an active region such as a dilute nitride active region, can be, for example, greater than 40 meV, greater than 50 meV, greater than 100 meV, greater than 250 meV, greater than 500 meV, or greater than 1,000 meV. A bandgap difference of an active region such as a dilute nitride active region, can be, for example, greater less than 50 meV, less than 100 meV, less than 250 meV, less than 500 meV, or less than 1,000 meV. A bandgap difference of an active region such as a dilute nitride active region can be, for example, from 40 meV to 1,000 meV, from 50 meV to 800 meV, from 100 meV to 700 meV, or from 200 meV to 600 meV.

Dark current for a photodetector is the current that can flow in the device when it is under bias but is not exposed to a light source, and thus acts as a noise source. Dark current is one of the contributors to the reduction of the signal-to-noise ratio of a photodetector and it is desirable to reduce the dark current to enhance photodetector performance. The dark current is related to the intrinsic (or background) carrier concentration within a semiconductor material. For semiconductor materials, the intrinsic carrier concentration, $n_i$ can depend exponentially on the material bandgap $E_g$ as:

$$n_i = \sqrt{N_c N_v} e^{-E_g/2kT}$$

where $N_c$ is the effective density of states in the conduction band, $N_v$ is the effective density of states in the valence band, k is Boltzmann's constant and T is the temperature. High bandgap semiconductor materials typically have lower dark current than low bandgap materials. For dilute nitride materials, the inclusion of N into the semiconductor introduces defects into the material. The addition of Sb to a dilute nitride alloy, as well as thermal annealing have been shown to improve crystallinity and lower the background carrier concentration. The background carrier concentration of an intrinsic or unintentionally doped dilute nitride active region, can be, for example, less than $1 \times 10^{16}$ cm$^{-3}$ (measured at room temperature (25° C.), less than $5 \times 10^{15}$ cm$^{-3}$, or less than $1 \times 10^{15}$ cm$^{-3}$. The background carrier concentration may be higher at lower bandgaps, than at higher bandgaps, associated with higher high N compositions usually required for such lower bandgaps. The background carrier concentration of the intrinsic or unintentionally doped active region, which is equivalent to the dopant concentration, can be, for example, less than $1 \times 10^{16}$ cm$^{-3}$ (measured at room temperature (25° C.), less than $5 \times 10^{15}$ cm$^{-3}$, or less than $1 \times 10^{15}$ cm$^{-3}$. Consequently, reducing the thickness of lower bandgap materials can be desirable. For devices with the same active region thickness, by using a graded or stepped bandgap active region, a semiconductor optoelectronic device having an active region with a minimum bandgap can have a lower dark current and lower dark noise than that for an equivalent device that has an active region with a constant bandgap that is equivalent to the minimum bandgap. For example, the dark current can be reduced by more than a factor of 10 or by more than a factor of 100. By using a graded or stepped bandgap active region, a semiconductor optoelectronic device with an active region having a minimum bandgap can have a signal-to-noise ratio that is higher than that for the same device except that the active region has a constant bandgap that is equivalent to the minimum bandgap.

A dilute nitride active region can include, for example, at least two portions of a single-layer active region or at least two layers of a multiple layer active region, having differing compositions, each having a different bandgap. A higher bandgap region may be used to absorb light up to a certain wavelength, while a lower bandgap region may be used to absorb longer wavelengths. The responsivity of the higher wavelength range absorbed in the second region may be maintained using additional structures. Consequently, it can be possible to reduce the dark current (when compared to a single region of low bandgap dilute nitride) by reducing the thickness of the lower bandgap material, while maintaining the responsivity of the device.

Figure 16:
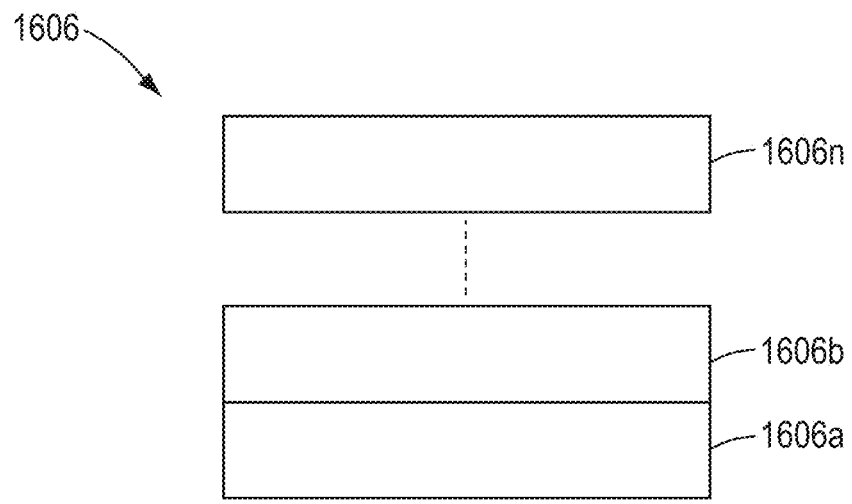
FIG. 16 shows a schematic cross-section of a dilute nitride active region according to an embodiment of the invention.

FIG. 16 shows a schematic cross-section of a dilute nitride active region 1606 that may be included in a device such as device 100, 200, 300 or 400, according to an embodiment of the invention. Active region 1606 includes a first active layer 1606a having a first bandgap ($E_{g1}$) and a first thickness ($t_1$) and at least a second active layer 1606b having a second bandgap ($E_{g2}$) that is different from the first bandgap and a second thickness $t_2$. Additional active layers, each having different bandgaps may also be included. FIG. 16 shows the possibility for n active layers stacked together, each with a different bandgap, with the bandgap of the $n^{th}$ layer denoted $E_{gn}$. The bandgap change within the multiple layer structure can be, for example, either monotonically increasing or monotonically decreasing within the multilayer structure. The bandgaps for the layers may be arranged such that $E_{g1} < E_{g2} < \ldots < E_{gn-1} < E_{gn}$, for example, or $E_{g1} > E_{g2} > \ldots > E_{gn-1} > E_{gn}$. The thickness of each of the active layers may, independently, be from 0.05 μm and 7.5 μm, such as from 0.1 μm to 5 μm, from 0.5 μm to 4 μm, or from 1 μm to 3 μm. The bandgap difference between the highest bandgap and the lowest bandgap can be, for example, at least 40 meV, or the bandgap difference can be less than 700 meV. Each of the active layers can comprise a dilute nitride material such as GaInNAsSb.

Figure 17:
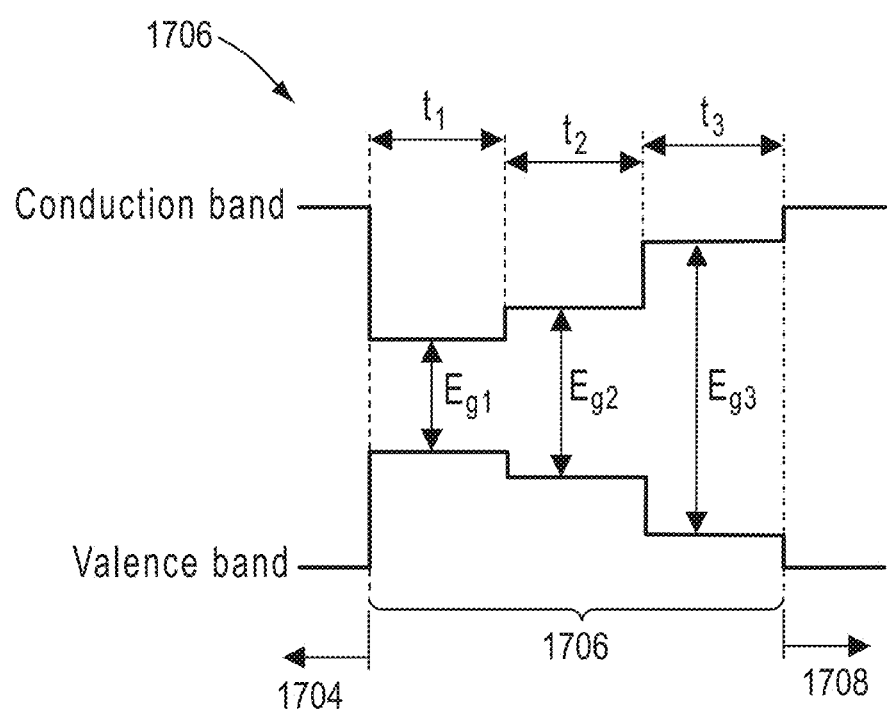
FIG. 17 shows a band edge alignment for a dilute nitride active region according to an embodiment of the invention.

FIG. 17 shows a band edge alignment for a dilute nitride active region 1706 according to an example in FIG. 16, where three different active layers form the active region, sandwiched between first doped region 1704 and second doped region 1708. First and second doped regions 1704/1708 may have opposite doping types, as described for device 100, 200, 300 and 400, and with compositions as described for device 100, 200, 300 and 400, with bandgaps larger than any of the bandgaps of the dilute nitride active region 1706. In this example, dilute nitride active region 1706 includes a first active layer having a bandgap $E_{g1}$, and thickness $t_1$, a second active region having a bandgap $E_{g2}$ that is greater than $E_{g1}$ and thickness $t_2$, and a third active region having a bandgap $E_{g3}$ that is greater than $E_{g2}$ and thickness $t_2$, forming an active region with a discontinuous or stepped bandgap profile. Each of the active layers in dilute nitride active region 1706 can comprise a dilute nitride material.

A photodetector device including active region 1706 can be illuminated from the top surface of the device, with light passing through second doped region 1708 into the active region 1706. The shortest wavelengths of light, corresponding to bandgaps larger than $E_{g3}$ but less than the bandgap of second doped region 1708 can be absorbed primarily by the third active layer, but may also be absorbed in the second and first active layers, depending on the layer thicknesses for each active layer. A second set of wavelengths, corresponding to energies between $E_{g2}$ and $E_{g3}$ can be absorbed primarily by the second active layer, but may also be absorbed in the first active layer, depending on the layer thicknesses for each active layer. The longest wavelengths, corresponding to energies between $E_{g1}$ and $E_{g2}$ can be absorbed by the first active layer. The thickness of this active layer may be reduced, when compared to a device with a single active layer having a bandgap $E_{g1}$. To increase the absorption within at least the first active layer, non-absorbed light may be reflected back into active region 1706 using an underlying reflector. Thus, in some embodiments, a distributed Bragg reflector (DBR) or a chirped distributed Bragg reflector (CDBR) may underlie active region 1706. Examples of CDBRs are described in U.S. Publication Application No. 2019/028143A1, which is incorporated by reference in its entirety.

The wavelength range that may be absorbed by active region 1706 can in part be determined by the minimum bandgap within the active region and the bandgap of overlying second doped region 1708. For a GaAs doped region, the minimum wavelength that may be absorbed and detected is about 870 nm. For an (Al)InGaP second doped region, the bandgap is larger, and so the minimum wavelength that may be absorbed and detected can decrease to about 500 nm or 400 nm, depending the composition of the active region. Therefore, a single detector can be capable of absorbing light in both visible and SWIR wavelength ranges.

In active region 1706, the number of active layers, the respective bandgaps and the respective thicknesses may be chosen to approximate any function for the bandgap change including a linear bandgap change or a non-linear bandgap change. The bandgap difference between the highest and lowest bandgaps can be, for example, from 40 meV to 700 meV.

The bandgap for each active layer of active region 1706 may be adjusted by changing the temperatures of the group III sources for each active layer, thereby controlling the growth rates and the semiconductor alloy composition (hence the bandgap). The bandgap for each active layer of active region 1706 may also be adjusted by altering the ratio of the group V elements during growth, the ratio between the group III fluxes and the group V fluxes, and/or by changing the substrate temperature.

Figure 18A:
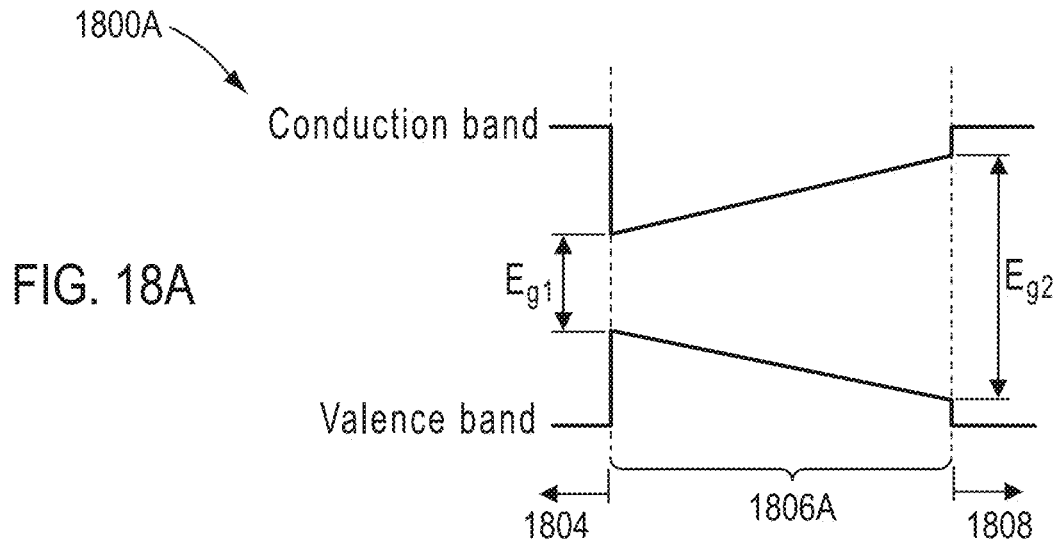
FIG. 18A shows a band edge alignment for a dilute nitride active region according to an embodiment of the invention.
Figure 18B:
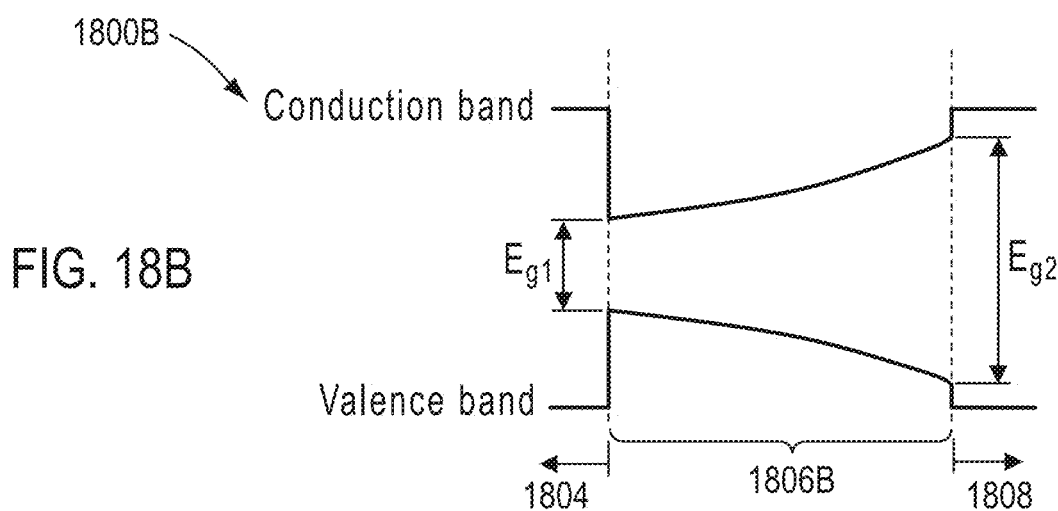
FIG. 18B shows a band edge alignment for a dilute nitride active region according to an embodiment of the invention.
Figure 18C:
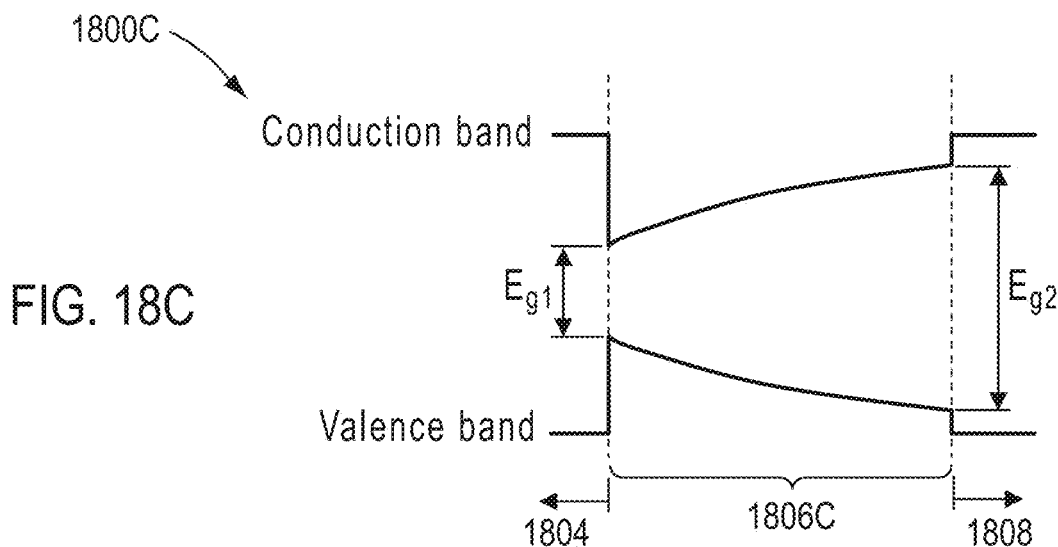
FIG. 18C shows a band edge alignment for a dilute nitride active region according to an embodiment of the invention.

Graded bandgaps may be used instead of stepped bandgap structures, as shown in FIGS. 18A, 18B and 18C, which include graded bandgap active regions 1806A, 1806B, or 1806C sandwiched between first doped region 1808 and second doped region 1804. A photodetector device including active regions 1806A, or 1806B or 1806C can be illuminated from the top surface of the device, with light passing through second doped region 1808 into the active region.

FIG. 18A shows an example of an active region 1806A having a linear bandgap variation from a bandgap of $E_{g1}$ at the interface with first doped region 1804 to a bandgap of $E_{g2}$ at the interface with second doped region 1808. The minimum bandgap difference is about 40 meV, and the largest bandgap difference is about 700 meV.

FIG. 18B shows an example of an active region 1806B having a non-linear bandgap variation from a bandgap of $E_{g1}$ at the interface with first doped region 1804 to a bandgap of $E_{g2}$ at the interface with second doped region 1808. In this example, the bandgap of active region 1806B increases from $E_{g1}$ to $E_{g2}$ with the bandgap increasing as a function of the position within the active region. The minimum bandgap difference is about 40 meV and the largest bandgap difference is about 700 meV. The bandgap can be implemented, for example, using a quadratic profile, an exponential profile, or other continuous profile, as a function of distance away from the interface between layer 1804 and active region 1806B. Other non-linear profiles may also be used.

The bandgap for active region 1806A, 1806B and 1806C may be adjusted by changing the temperatures of the group III sources during growth of the layer, thereby controlling the growth rates and the semiconductor alloy composition (hence the bandgap). The bandgap for active region 1806A, 1806B and 1806C may also be adjusted by altering the ratio of the group V elements during growth, the ratio between the group III fluxes and the group V fluxes, and/or by changing the substrate temperature.

FIG. 18C shows an example of an active region 1806C having a non-linear bandgap variation from a bandgap of $E_{g1}$ at the interface with first doped region 1804 to a bandgap of $E_{g2}$ at the interface with second doped region 1808. In this example, the bandgap of active region 1806B increases in value from $E_{g1}$ to $E_{g2}$ with the bandgap decreasing as a function of the position within the active region. The minimum bandgap difference is about 40 meV and the largest bandgap difference is about 700 meV. The bandgap profile can be implemented, for example, using a logarithmic profile as a function of distance from the interface between layer 1804 and active region 1806B, though other non-linear profiles may also be used.

Active regions according to the invention may also incorporate both composition steps and composition grades within the composition steps.

A reflector can underly the active region and can reflect light that may not be absorbed in the active region back into the active region to increase absorption of light within the active region. The reflector is designed to reflect light at wavelengths absorbed by at least the active region with the smallest bandgap. This may be required in embodiment where the thickness of active region, or a portion of the active region is not sufficient to absorb all light within a single pass through the active region.

Figure 19:
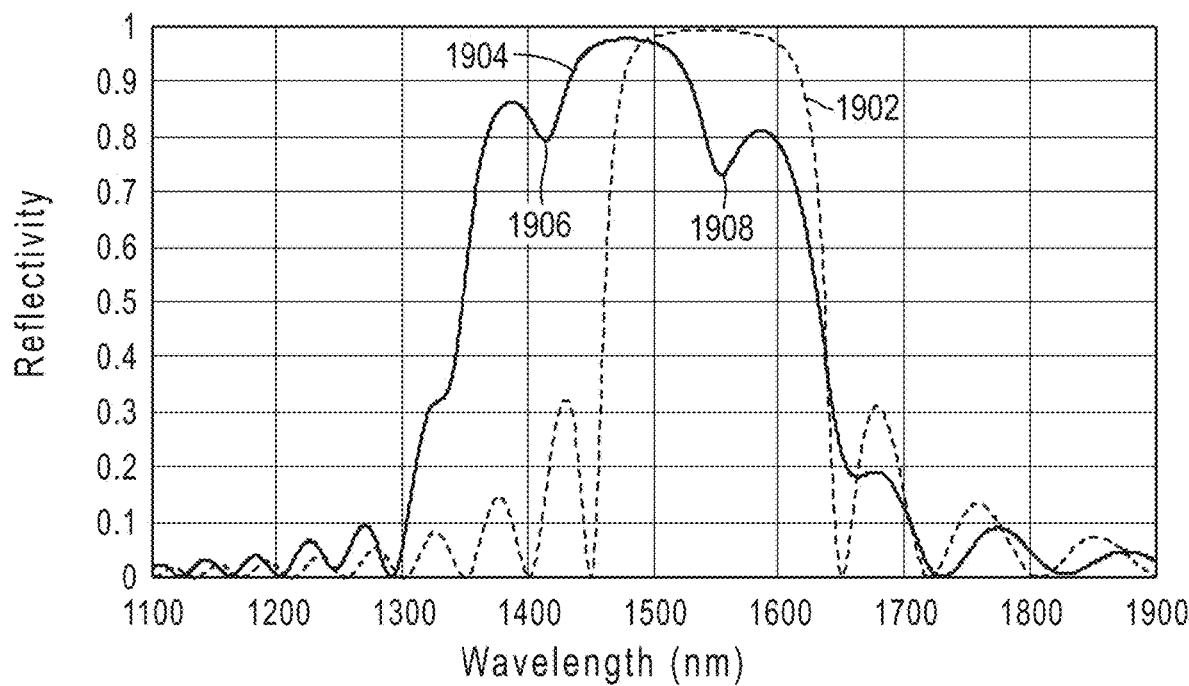
FIG. 19 shows reflectivity spectra for a non-chirped distributed Bragg reflector and for a chirped distributed Bragg reflector.

FIG. 19 shows simulated reflectivity spectra for a conventional DBR and a CDBR at normal incidence. Both designs were configured to have a long-wavelength cut-off of the FWHM of the reflectivity spectrum at an energy of about 0.76 eV, corresponding to a wavelength of about 1630 nm. The reflectivity spectrum of the conventional DBR is shown as curve 1902 and the reflectivity spectrum of the CDBR is shown as curve 1904.

The conventional DBR includes 20.5 pairs of GaAs/AlAs mirror layers, with mirror layer thicknesses of approximately 115 nm and 132 nm, for the GaAs and AlAs layers, respectively. The peak reflectivity of just over 99% for reflectivity spectrum 1902 occurs at a wavelength of approximately 1540 nm, and the FWHM of the reflectivity spectrum 1402 is approximately 175 nm. Therefore, the responsivity of an overlying active layer for a photodetector may be enhanced over an approximately 175 nm range between wavelengths of about 1460 nm and 1635 nm. Correspondingly, a first active layer of the active region may have a bandgap of approximately 0.76 eV, close to the long wavelength cut-off wavelength of the DBR. The short-wavelength cut-off for the DBR corresponds to an energy of approximately 0.85 eV. For a detector having two active layers with different bandgaps, the bandgap for the second active layer may be chosen to be approximately 0.85 eV, or approximately 0.84 eV, with a corresponding bandgap change of about 90 meV or about 80 meV for the two active layers. In some embodiments, the bandgap of the second active layer may be within about 25 meV of the short wavelength cutoff for the DBR. The reflectivity spectrum of the DBR may be designed to reflect light back into the active region having at least two active layers with different bandgaps, with the detector having a bandgap difference of at least about 80 meV or about 90 meV between the smallest bandgap and the largest bandgap.

Referring to FIG. 19, the CDBR included 20.5 pairs of GaAs/AlAs mirror layers, with a chirp fraction of approximately 5%. Whereas for a non-chirped DBR, the layer thicknesses are chosen to be $\lambda_0/4n$ (where $\lambda_0$ is the design wavelength and n is the refractive index of a mirror layer) to optimize reflection at a single wavelength, in the CDBR the thickest layers are chosen to have a thickness of $(1+C) \lambda_0/4n$ and the thinnest layers have a thickness of $(1-C) \lambda_0/4n$, where C is the chirp fraction. In this example, several pairs of layers with the same thicknesses were used in groupings, the chirp being applied over the adjacent groupings. The thickest mirror layers had thicknesses of approximately 115 nm and 132 nm for the GaAs, and AlAs layers, respectively. The thinnest mirror layers had thicknesses of approximately 105 nm and 121 nm for the GaAs, and AlAs layers, respectively. For reflectivity spectrum 1904, a peak reflectivity of approximately 98% occurs at a wavelength of approximately 1480 nm, and the FWHM is approximately 285 nm between wavelengths of approximately 1345 nm and 1630 nm. Therefore, the responsivity of an overlying active region for a photodetector may be enhanced over an approximately 285 nm range between wavelengths of about 1345 nm and 1630 nm.

Reflectivity spectrum 1904 has two dips 1906 and 1908 within the FWHM. However, it will be understood that these may be compensated for by insertion of additional GaAs and AlAs layers having different thicknesses designed to increase the reflectivity at the wavelengths associated with dips 1906 and 1908. While the maximum reflectivity of spectrum 1904 is less than that for spectrum 1902, the FWHM is increased by approximately 110 nm, thereby capable of improving the responsivity of an overlying active region for a detector over a greater wavelength range than a conventional DBR. The lower wavelength cutoff for reflectivity spectrum 1904 corresponds to a bandgap energy of approximately 0.92 eV. For a photodetector having two active layers with different bandgaps, the bandgap of the second active layer can be chosen to be approximately 0.92 eV, or approximately 0.9 eV, providing a bandgap difference of approximately 160 meV or approximately 140 meV. In some embodiments, the bandgap of the second active layer may be within about 25 meV of the short wavelength cutoff for the DBR. In certain embodiments, the reflectivity spectrum may be designed to reflect transmitted light back into the active region having two active layers with different bandgaps, with the detector having a bandgap difference of at least about 160 meV or about 140 meV between the smallest bandgap and the largest bandgap. Thus, the use of a reflector such as a DBR or a CDBR can allow the thickness of the low bandgap absorbing layer to be reduced to reduce dark current.

ASPECTS OF THE INVENTION

The invention is further defined by the following aspects.

Aspect 1. A compound semiconductor optoelectronic structure, comprising: a substrate having a substrate surface; a first doped region overlying the substrate surface; an active region overlying the first doped region, wherein the active region comprises: a dilute nitride material; and the active region has a bandgap that is non-uniform orthogonal to the substrate surface; and a second doped region overlying the active region.

Aspect 2. The structure of aspect 1, wherein the bandgap is within a range from 0.7 eV to 1.4 eV.

Aspect 3. The structure of any one of aspects 1 to 2, wherein the active region has a thickness from 0.2 µm to 10 µm.

Aspect 4. The structure of any one of aspects 1 to 2, wherein the active region comprises a single active layer.

Aspect 5. The structure of aspect 4, wherein the bandgap varies continuously within at least a portion the thickness of the active region.

Aspect 6. The structure of any one of aspects 4 to 5, wherein the bandgap varies continuously throughout the thickness of the active region.

Aspect 7. The structure of any one of aspects 4 to 5, wherein the bandgap varies linearly throughout the thickness of the active region.

Aspect 8. The structure of any one of aspects 4 to 5, wherein the bandgap varies non-linearly throughout the thickness of the active region.

Aspect 9. The structure of any one of aspects 4 to 5, wherein the bandgap varies quadratically or exponentially throughout the thickness of the active region.

Aspect 10. The structure of any one of aspects 1 to 9, wherein the active region comprises intrinsic doping or is unintentionally doped.

Aspect 11. The structure of any one of aspects 1 to 9, wherein the active region is intentionally doped.

Aspect 12. The structure of aspect 11, wherein the intentionally doped active region comprises a constant doping profile, a discontinuous doping profile or a continuous doping profile.

Aspect 13. The structure of aspect 12, wherein the discontinuous doping profile comprises a stepped doping profile Aspect 14. The structure of aspect 12, wherein the continuous doping profile comprises a linear doping profile or a non-linear doping profile, Aspect 15. The structure of aspect 14, wherein the non-linear doping profile comprises a quadratic doping profile or an exponential doping profile.

Aspect 16. The structure of any one of aspects 11 to 15, wherein the intentionally doped active region comprises a p-type dopant.

Aspect 17. The structure of any one of aspects 11 to 15, wherein the intentionally doped active region comprises a n-type dopant.

Aspect 18. The structure of any one of aspects 1 to 17, wherein the bandgap increases with distance from the substrate.

Aspect 19. The structure of any one of aspects 1 to 17, wherein the bandgap decreases with distance from the substrate.

Aspect 20. The structure of any one of aspects 1 to 19, wherein the active region comprises two or more active layers.

Aspect 21. The structure of aspect 20, wherein each of the two or more active layers comprises a dilute nitride material.

Aspect 22. The structure of any one of aspects 20 to 21, wherein each of the two or more active layers has a different bandgap than each of the other active layers.

Aspect 23. The structure of any one of aspects 20 to 22, wherein at least one of the two or more active layers has a uniform bandgap.

Aspect 24. The structure of any one of aspects 20 to 23, wherein each of the two or more active layers has a uniform bandgap.

Aspect 25. The structure of any one of aspects 20 to 23, wherein at least one of the two or more active layers has a non-uniform bandgap.

Aspect 26. The structure of aspect 25, wherein the non-uniform bandgap varies continuously throughout the thickness of the active layer.

Aspect 27. The structure of aspect 25, wherein the non-uniform bandgap varies linearly throughout the thickness of the active layer.

Aspect 28. The structure of aspect 25, wherein the non-uniform bandgap varies non-linearly throughout the thickness of the active layer.

Aspect 29. The structure of aspect 25, wherein the non-uniform bandgap varies quadratically or exponentially throughout the thickness of the active layer.

Aspect 30. The structure of aspect 20, wherein each of the two or more active layers independently comprises a uniform bandgap or a non-uniform bandgap.

Aspect 31. The structure of any one of aspects 20 to 30, wherein each of the two or more active layers independently comprises an intrinsically doped active layer or an intentionally doped active layer.

Aspect 32. The structure of aspect 31, wherein the intentionally doped active layer comprises a constant doping profile, a discontinuous doping profile or a continuous doping profile.

Aspect 33. The structure of aspect 32, wherein the discontinuous doping profile comprises a stepped doping profile.

Aspect 34. The structure of aspect 33, wherein the continuous doping profile comprises a linear doping profile or a non-linear doping profile.

Aspect 35. The structure of aspect 34, wherein the non-linear doping profile comprises a quadratic doping profile or an exponential doping profile.

Aspect 36. The structure of any one of aspects 31 to 35, wherein the intentionally doped active layer comprises a p-type dopant.

Aspect 37. The structure of any one of aspects 31 to 35, wherein the intentionally doped active layer comprises a n-type dopant.

Aspect 38. The structure of aspect 20, wherein, each of the two or more active layers has a uniform bandgap; and the bandgap of the two or more active layers increases with distance from the substrate.

Aspect 39. The structure of aspect 20, wherein, each of the two or more active layers has a uniform bandgap; and the bandgap of the two or more active layers decreases with distance from the substrate.

Aspect 40. The structure of any one of aspects 20 to 39, wherein each of the two or more active layers independently has a thickness from 50 nm to 7.5 µm.

Aspect 41. The structure of any one of aspects 1 to 40, wherein the substrate comprises GaAs, AlGaAs, Ge, SiGeSn, or buffered Si.

Aspect 42. The structure of aspect 41, wherein the buffered Si substrate comprises a SiGe-buffered Si substrate, SiGeSn-buffered Si substrate, and rare-earth (RE) buffered Si substrate, such as a rare-earth oxide (REO)-buffered Si substrate.

Aspect 43. The structure of any one of aspects 1 to 42, wherein a bandgap difference between the lowest bandgap and the highest bandgap of the dilute nitride material within the active region is at least 40 meV.

Aspect 44. The structure of aspect 43, wherein the bandgap difference is from 40 meV to 700 meV.

Aspect 45. The structure of any one of aspects 1 to 44, wherein the dilute nitride material is lattice-matched to the substrate or the dilute nitride material is pseudomorphically strained with respect to the substrate.

Aspect 46. The structure of any one of aspects 1 to 45, wherein the dilute nitride material has a compressive strain within a range from 0% to 0.4% with respect to the substrate.

Aspect 47. The structure of any one of aspects 1 to 46, wherein the dilute nitride material has a lattice constant less than 3% the lattice constant of GaAs or Ge.

Aspect 48. The structure of any one of aspects 1 to 47, wherein the dilute nitride material comprises GaInNAs, GaNAsSb, GaInNAsSb, GaInNAsBi, GaNAsSbBi, GaNAsBi, GaInNAsSbBi, or a combination of any of the foregoing.

Aspect 49. The structure of any one of aspects 1 to 48, wherein the dilute nitride material comprises $Ga_{1-x}In_xN_yAs_{1-y-z}Sb_z$, wherein $0 \leq x \leq 0.4$, $0 < y \leq 0.07$, and $0 < z \leq 0.04$.

Aspect 50. The structure of any one of aspects 1 to 48, wherein the dilute nitride material comprises $Ga_{1-x}In_xN_yAs_{1-y-z}Sb_z$, wherein, $0.12 \leq x \leq 0.24$, $0.03 \leq y \leq 0.07$ $0.001 \leq z \leq 0.02$; $0.12 \leq x \leq 0.24$, $0.03 \leq y \leq 0.07$, and $0.005 \leq z \leq 0.04$; $0.13 \leq x \leq 0.20$, $0.03 \leq y \leq 0.045$ and $0.001 \leq z \leq 0.02$; $0.13 \leq x \leq 0.18$, $0.03 \leq y \leq 0.04$ and $0.001 \leq z \leq 0.02$; or $0.18 \leq x \leq 0.24$, $0.04 \leq y \leq 0.07$ and $0.01 \leq z \leq 0.04$.

Aspect 51. The structure of any one of aspects 1 to 50, wherein the dilute nitride material has a photoluminescence full-width-half-maximum (FWHM) from 50 nm to 150 nm as determined using photoluminescence spectroscopy.

Aspect 52. The structure of any one of aspects 1 to 51, wherein an X-ray diffraction (XRD) pattern of the dilute nitride material exhibits a splitting from 300 arcsec to 1,000 arcsec.

Aspect 53. The structure of any one of aspects 1 to 52, wherein the dilute nitride material exhibits a carrier lifetime from 1.1 nanoseconds to 2.5 nanoseconds as measured at room temperature at an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

Aspect 54. The structure of any one of aspects 1 to 53, wherein, the first doped region comprises a p-type dopant and the second doped region comprises an n-type dopant; or the first doped region comprises an n-type dopant and the second doped region comprises an p-type dopant.

Aspect 55. The structure of any one of aspects 1 to 54, wherein each of the first doped region and the second doped region independently comprises a dopant concentration from $1 \times 10^{15}$ cm$^{-3}$ to $2 \times 10^{19}$ cm$^{-3}$.

Aspect 56. The structure of any one of aspects 1 to 55, wherein each of the first doped region and the second doped region independently comprises GaAs, AlGaAs, GaInAs, (Al)GaInP, (Al)GaInPAs, AlInP, GaInNAs, GaInNAsSb, or a combination of any of the foregoing.

Aspect 57. The structure of any one of aspects 1 to 56, wherein each of the first doped region and the second doped region independently has a bandgap that is greater than the largest bandgap of a material within the active region.

Aspect 58. The structure of any one of aspects 1 to 57, wherein each of the first doped region and the second doped region comprises a contact layer and a barrier layer, wherein the barrier layer is adjacent the active region.

Aspect 59. The structure of any one of aspects 1 to 58, wherein each of the first doped region and the second doped region independently comprises a thickness from 30 nm to 30 µm.

Aspect 60. The structure of any one of aspects 1 to 59, further comprising a multiplication layer overlying the first doped region and underlying the active region.

Aspect 61. The structure of any one of aspects 1 to 60, further comprising a reflector underlying the active region.

Aspect 62. The structure of aspect 61, wherein the reflector is configured to reflect light at wavelengths capable of being absorbed by the active region.

Aspect 63. The structure of any one of aspects 61 to 62, wherein the reflector comprises a distributed Bragg reflector.

Aspect 64. The structure of any one of aspects 61 to 62, wherein the reflector comprises a chirped distributed Bragg reflector.

Aspect 65. A device comprising the structure of any one of aspects 1 to 64.

Aspect 66. The device of aspect 64, wherein the device has a diameter from 20 µm to 3 mm.

Aspect 67. The device of any one of aspects 65 to 66, wherein sidewalls of the device have an angle from 70 degrees to 90 degrees with respect to the substrate surface.

Aspect 68. The device of any one of aspects 65 to 67, wherein the device comprises a plurality of the semiconductor structures of any one of claims 1 to 64.

Aspect 69. The device of any one of aspects 65 to 68, wherein the device comprises a photodetector.

Aspect 70. The device of any one of aspects 65 to 69, wherein the device comprises a photodetector array.

Aspect 71. The device of any one of aspects 65 to 70, further comprising a reflector, wherein the reflector underlies the active region and is configured to reflect light at wavelengths capable of being absorbed by material within the active region having the lowest bandgap.

Aspect 72. The device of any one of aspects 65 to 71, wherein the device has a responsivity from 0.55 A/W to 0.90 A/W as determined using a broad-band halogen lamp, with light monochromatized with a 10 nm wavelength band.

Aspect 73. A method of forming a semiconductor optoelectronic device, comprising: forming a first doped region overlying a substrate having a surface; forming an active region overlying the first doped region, wherein, the active region comprises a dilute nitride material; and the active region has a bandgap that is non-uniform orthogonal to the substrate surface; and forming a second doped region overlying the active region.

Aspect 74. The method of aspect 73, wherein a bandgap difference between the lowest bandgap and the highest bandgap of the dilute nitride material within the active region is at least 40 meV.

Aspect 75. The method of any one of aspects 73 to 74, wherein the dilute nitride material comprises GaInNAs, GaNAsSb, GaInNAsSb, GaInNAsBi, GaNAsSbBi, GaNAsBi, GaInNAsSbBi, or a combination of any of the foregoing.

Aspect 76. The method of any one of aspects 73 to 75, wherein the dilute nitride material comprises $Ga_{1-x}In_xN_yAs_{1-y-z}Sb_z$, wherein $0 \leq x \leq 0.4$, $0 < y \leq 0.07$, and $0 \leq z \leq 0.04$.

Aspect 77. The method of any one of aspects 73 to 76, wherein the dilute nitride layer comprises $Ga_{1-x}In_xN_yAs_{1-y-z}Sb_z$, wherein $0.12 \leq x \leq 0.24$, $0.03 \leq y \leq 0.07$ and $0.001 \leq z \leq 0.02$; $0.12 \leq x \leq 0.24$, $0.03 \leq y \leq 0.07$, and $0.005 \leq z \leq 0.04$; $0.13 \leq x \leq 0.2$, $0.03 \leq y \leq 0.045$ and $0.001 \leq z \leq 0.02$; $0.13 \leq x \leq 0.18$, $0.03 \leq y \leq 0.04$ and $0.001 \leq z \leq 0.02$; or $0.18 \leq x \leq 0.24$, $0.04 \leq y \leq 0.07$ and $0.01 \leq z \leq 0.04$.

Aspect 78. The method of any one of aspects 73 to 77, wherein the active region has a thickness within a range from 0.2 µm and 10 µm.

Aspect 79. The method of any one of aspects 73 to 78, wherein the substrate comprises GaAs, AlGaAs, Ge, SiGeSn, or buffered Si.

Aspect 80. The method of any one of aspects 73 to 79, wherein the dilute nitride material has a lattice constant less than 3% the lattice constant of GaAs or Ge.

Aspect 81. The method of any one of aspects 73 to 80, wherein the dilute nitride material has a compressive strain within a range from 0% and 0.4% with respect to the substrate.

Aspect 82. The method of any one of aspects 73 to 81, wherein the device comprises a photodetector.

Aspect 83. A semiconductor optoelectronic device fabricated using the method of any one of aspects 73 to 82.

Aspect 84. The semiconductor optoelectronic device of aspect 83, wherein the device comprises a photodetector.

Aspect 85. The semiconductor optoelectronic device of aspect 83, wherein the device comprises a photodetector array.

Aspect 86. The semiconductor optoelectronic device of aspect 84, wherein, the active region has a minimum bandgap; and the device has a dark current, wherein the dark current less than a dark current of a device having the same structure except that the active region has a constant bandgap that is equivalent to the minimum bandgap.

Aspect 87. The semiconductor optoelectronic device of aspect 84, wherein, the active region has a minimum bandgap; and the device has a signal-to-noise ratio, wherein the signal-to-noise ratio is higher than a signal-to-noise ratio of a device having the same structure except that the active region has a constant bandgap that is equivalent to the minimum bandgap.

EXAMPLES

The following examples describe in detail examples of compounds, devices and methods provided by the present disclosure. It will be apparent to those skilled in the art that many modifications, both to materials and methods, may be practiced without departing from the scope of the disclosure.

Example 1

X-Ray and Photoluminescence Characterization of GaInNAsSb Layers

Figure 6:
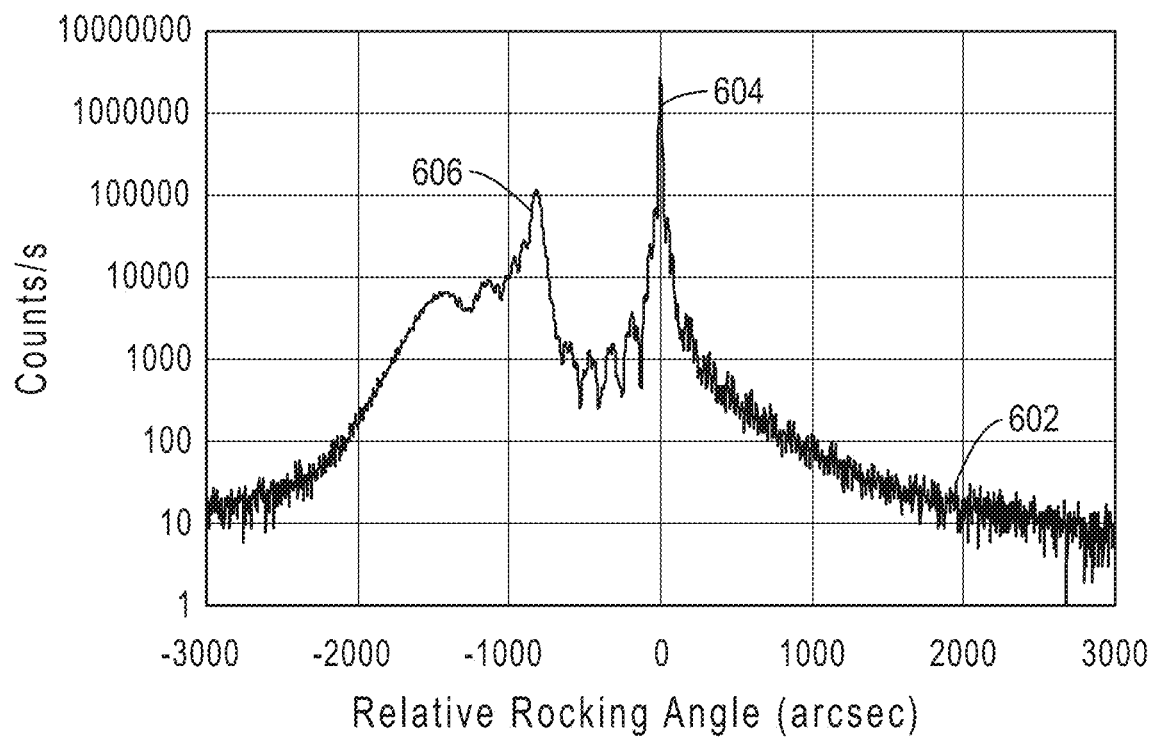
FIG. 6 shows an X-ray diffraction scan of a GaInNAsSb dilute nitride layer formed on a GaAs substrate according to the present invention.
Figure 7:
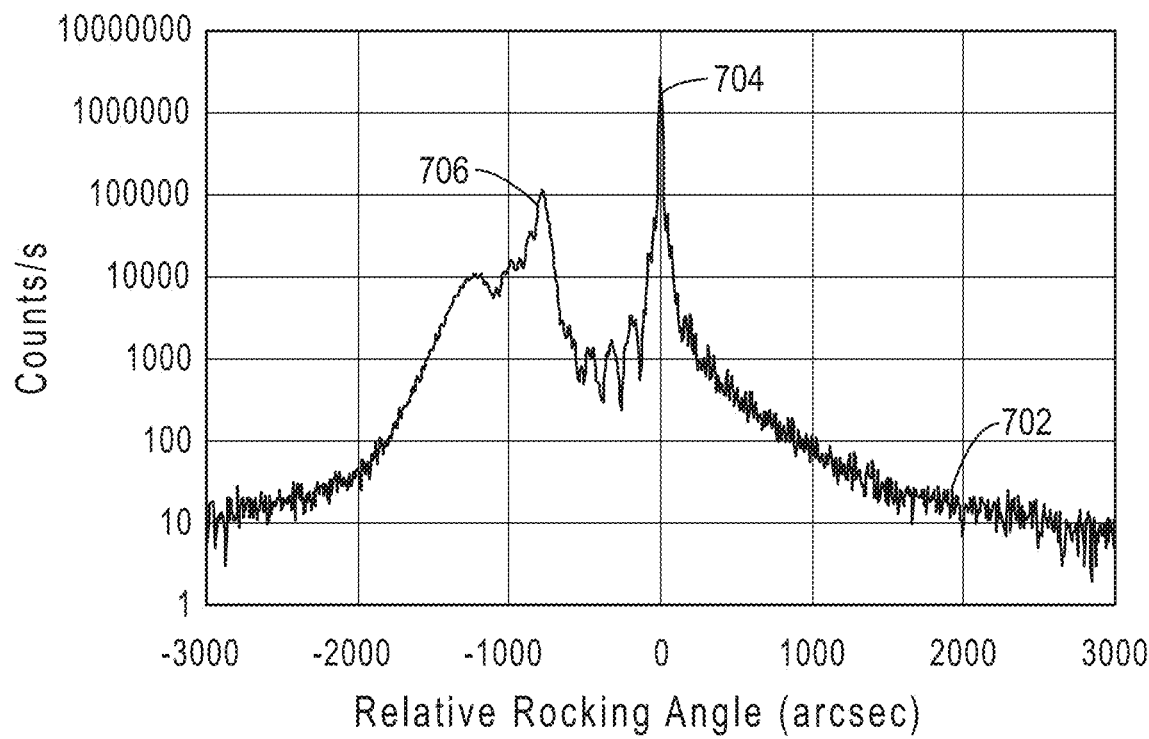
FIG. 7 shows an X-ray diffraction scan of another GaInNAsSb dilute nitride layer formed on a GaAs substrate according to the present invention.

Dilute nitride GaInNAsSb materials, with bandgaps between about 0.8 eV and 0.92 eV, suitable for incorporation into photodetectors have been characterized by X-ray diffraction (XRD) and photoluminescence (PL) spectroscopy. The thickness of the dilute nitride active layer for the samples was approximately 0.5 µm. FIGS. 6 and 7 show XRD scans for GaInNAsSb layers, with bandgaps of about 0.855 eV and 0.912 eV, respectively, epitaxially formed using MBE on GaAs substrates. The GaInNAsSb layers are pseudomorphic layers (non-relaxed).

As shown in FIG. 6, scan 602 for the 0.855 eV material has two peaks 604 and 606, indicating the presence of two different lattice parameters. Peak 604 corresponds to the lattice parameter of the GaAs substrate and peak 606 corresponds to the lattice parameter for the GaInNAsSb layer. Peak 606 is shifted by about −820 arcsec from peak 604, indicating that the GaInNAsSb layer is compressively strained with respect to GaAs.

As shown in FIG. 7, scan 702 for the 0.912 eV material has two peaks 704 and 706, indicating the presence of two different lattice parameters. Peak 704 corresponds to the lattice parameter of the GaAs substrate and peak 706 corresponds to the lattice parameter of the GaInNAsSb layer.

Peak 706 is shifted by about −780 arcsec from peak 704, indicating the GaInNAsSb layer is compressively strained with respect to GaAs.

The narrowness of peaks 604, 606, 704, and 706 indicates that the GaInNAsSb layers have high crystallinity and low defect levels.

Figure 8:
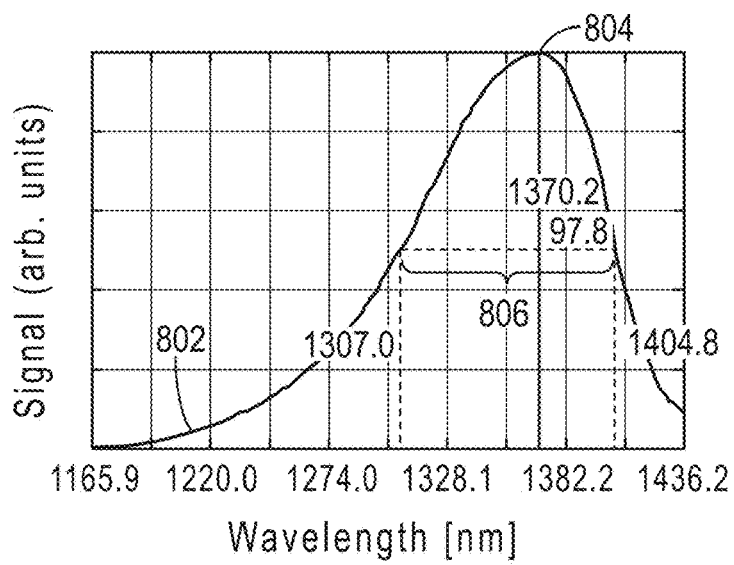
FIG. 8 shows a photoluminescence spectrum for a GaInNAsSb layer grown on a GaAs substrate according to the present invention.
Figure 9:
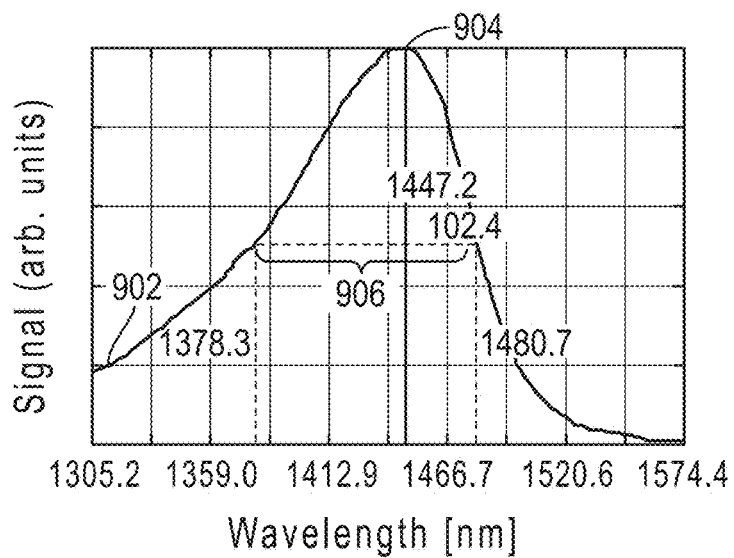
FIG. 9 shows a photoluminescence spectrum for another GaInNAsSb layer grown on a GaAs substrate according to the present invention.
Figure 10:
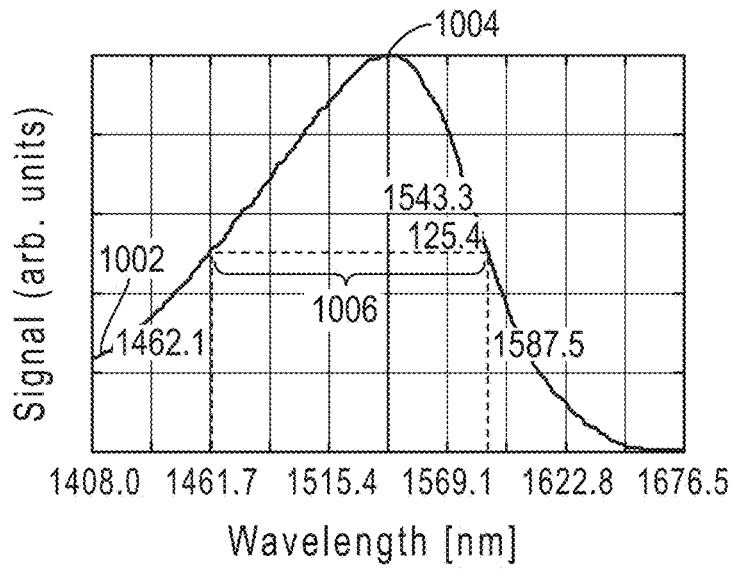
FIG. 10 shows a photoluminescence spectrum for another GaInNAsSb layer grown on a GaAs substrate according to the present invention.

FIGS. 8, 9 and 10 show PL spectra for different GaInNAsSb material samples with bandgaps between about 0.8 eV and 0.92 eV.

As shown in FIG. 8, scan 802 includes a peak 804 at a wavelength of 1370.2 nm, corresponding to an energy of about 0.905 eV. Scan 802 includes a full-width-half-maximum (FWHM) 806 of 97.8 nm. This narrow FWHM indicates good material quality.

As shown in FIG. 9, scan 902 includes a peak 904 at a wavelength of 1447.2 nm, corresponding to an energy of about 0.857 eV. Scan 902 includes a full-width-half-maximum (FWHM) 906 of 102.4 nm. This narrow FWHM indicates good material quality.

As shown in FIG. 10, scan 1002 includes a peak 1004 at a wavelength of 1543.3 nm, corresponding to an energy of about 0.803 eV. Scan 1002 includes a full-width-half-maximum (FWHM) 1006 of 125.4 nm. This narrow FWHM also indicates good material quality.

Example 2

GaInNAsSb-Based Photodetectors Grown on GaAs

Photodetectors incorporating a single-layer dilute nitride region comprising GaInNAsSb and having bandgaps within a range from 0.9 eV to 0.92 eV were fabricated. The $Ga_{1-x}In_xN_yAs_{1-y-z}Sb_z$ had a composition in which $0.12 \leq x \leq 0.24$, $0.03 \leq y \leq 0.07$ and $0.001 \leq z \leq 0.02$, such as $0.13 \leq x \leq 0.2$, $0.03 \leq y \leq 0.045$ and $0.001 \leq z \leq 0.02$, or $0.13 \leq x \leq 0.18$, $0.03 \leq y \leq 0.04$ and $0.001 \leq z \leq 0.02$. The structure of the photodetectors is shown in FIG. 4. Photoluminescence (PL) measurements for the dilute nitride layers exhibited a full-width half maximum within a range from 50 nm to 70 nm. The thickness of the dilute nitride layers was within a range from 0.5 μm to 1.5 μm. The photodetector structures included a semi-insulating (SI) GaAs substrate. The first contact layer was a p-doped GaAs layer with a thickness of 1 μm, and a doping level of $5 \times 10^{18}$ cm$^{-3}$. The first barrier layer was a p-doped GaAs layer with a thickness of 0.1 μm, and a doping level of $1 \times 10^{18}$ cm$^{-3}$. The active region was an intrinsic (or unintentionally doped) GaInNAsSb layer. The second barrier layer was an n-doped GaAs layer with a thickness of 0.1 μm, and a doping level of $1 \times 10^{18}$ cm$^{-3}$. The second contact layer was an n-doped GaAs layer with a thickness of 50 nm and a doping level of $1 \times 10^{19}$ cm$^{-3}$. The strain of the dilute nitride layer was characterized using high-resolution X-ray diffraction (XRD) and exhibited a peak splitting between the substrate and dilute nitride layer within a range from 600 arcsec to 1000 arcsec, corresponding to a compressive strain of 0.2% to 0.35%. Devices with active regions with compressive strain up to 0.4% are also possible. Photodetectors with diameters within a range from 20 μm to 3 mm were also fabricated.

Detectors, and arrays of detectors, were fabricated by etching through the dilute nitride materials to form mesa structures, with device diameters up to about 1 mm. Methods to etch dilute nitride materials include wet etch processes such as those described in U.S. Pat. Nos. 9,263,611 and 9,627,561, each of which is incorporated by reference in its entirety, and dry etch techniques such as using an inductance-coupled plasma (ICP). The etch process can be configured to provide smooth sidewalls, with sidewall angles between about 80° and 90° (perpendicular to the substrate), or between about 70° and 90°.

Figure 11A:
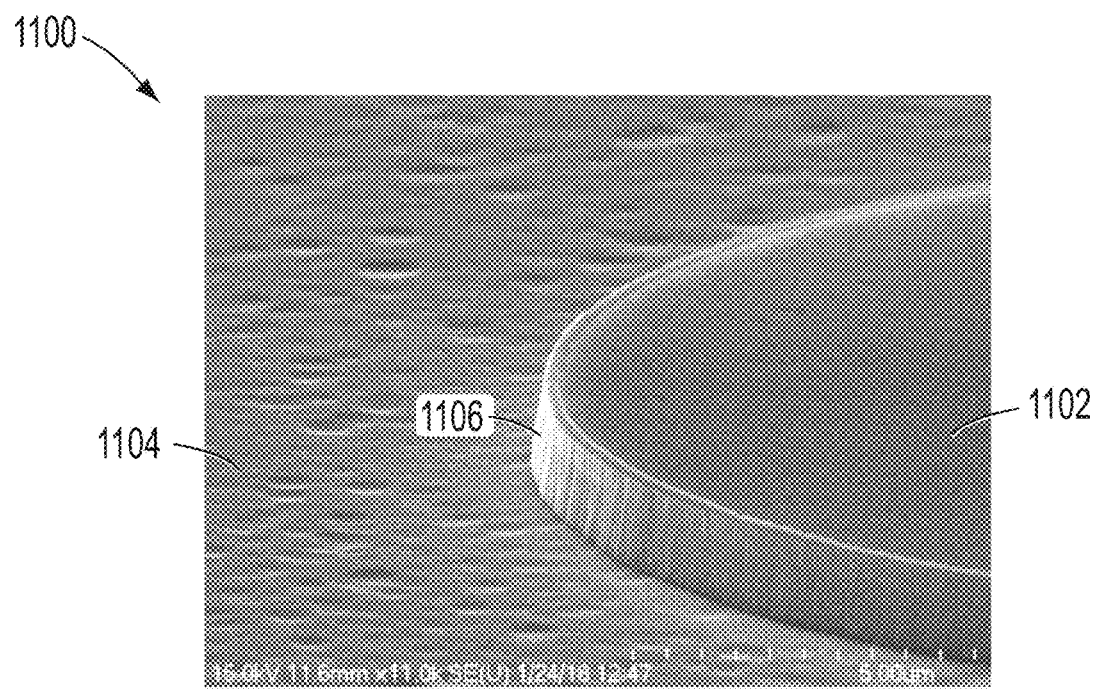
FIG. 11A is a photograph of a scanning electron microscopy (SEM) image of an etched mesa for a GaInNAsSb dilute nitride photodetector.

FIG. 11A shows a scanning electron microscopy (SEM) image of a GaInNAsSb dilute nitride material etched using an ICP etch, forming a mesa 1100. Mesa 1100 has a top surface 1102, a bottom surface 1104, and a sidewall 1106 having a sidewall angle with respect to the surface. The sidewall angle is less than 90° but greater than 80°. Standard passivation and metallization steps known in the art were used to complete the devices.

Figure 11B:
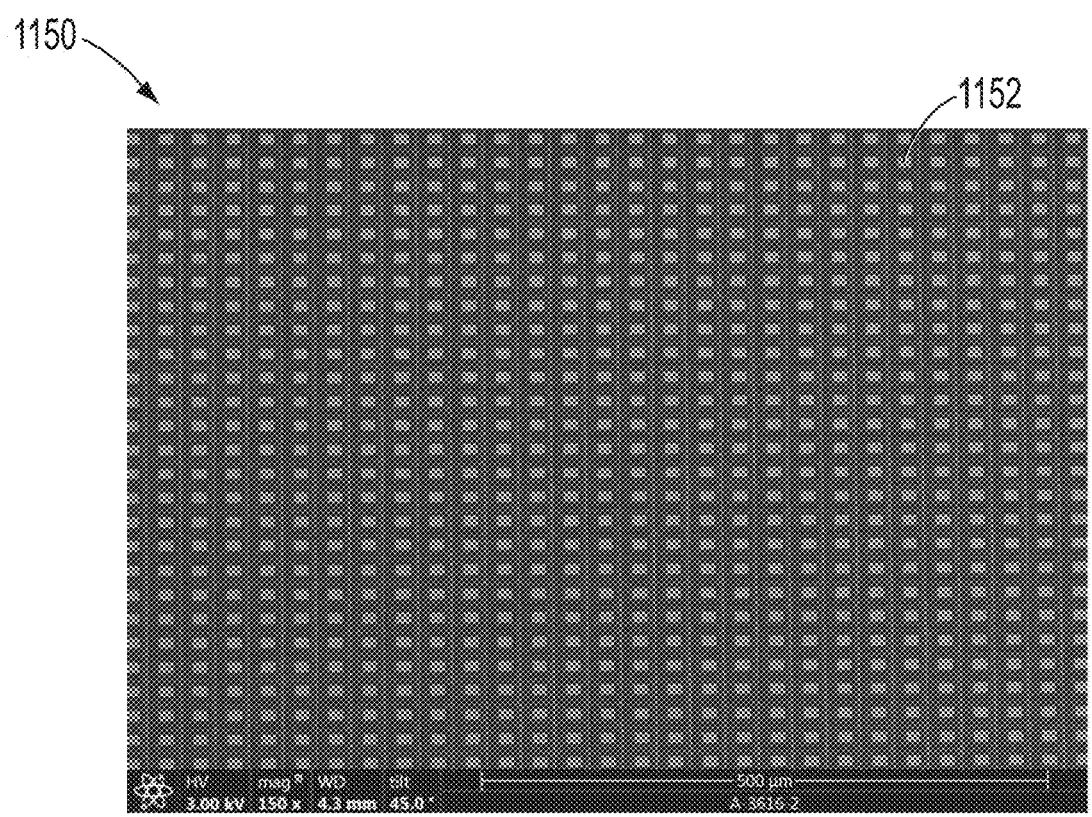
FIG. 11B is a photograph of a scanning electron microscopy (SEM) image of an array of photodetectors according to the present invention.

FIG. 11B shows a scanning electron microscopy image of part of an array of GaInNAsSb dilute nitride photodetectors 1150. Array 1150 is formed by a two-dimensional array of photodetector mesa structures 1152. Arrays of 320 by 256 detector elements or pixels have been fabricated. The sidewall angles allow closely spaced photodetectors. In some embodiments, the length and width of mesa 1100 may each be approximately 6 μm. In some embodiments, the minimum mesa pitch may be 30 μm. In other embodiments, the minimum mesa pitch may be 12 μm.

Figure 12:
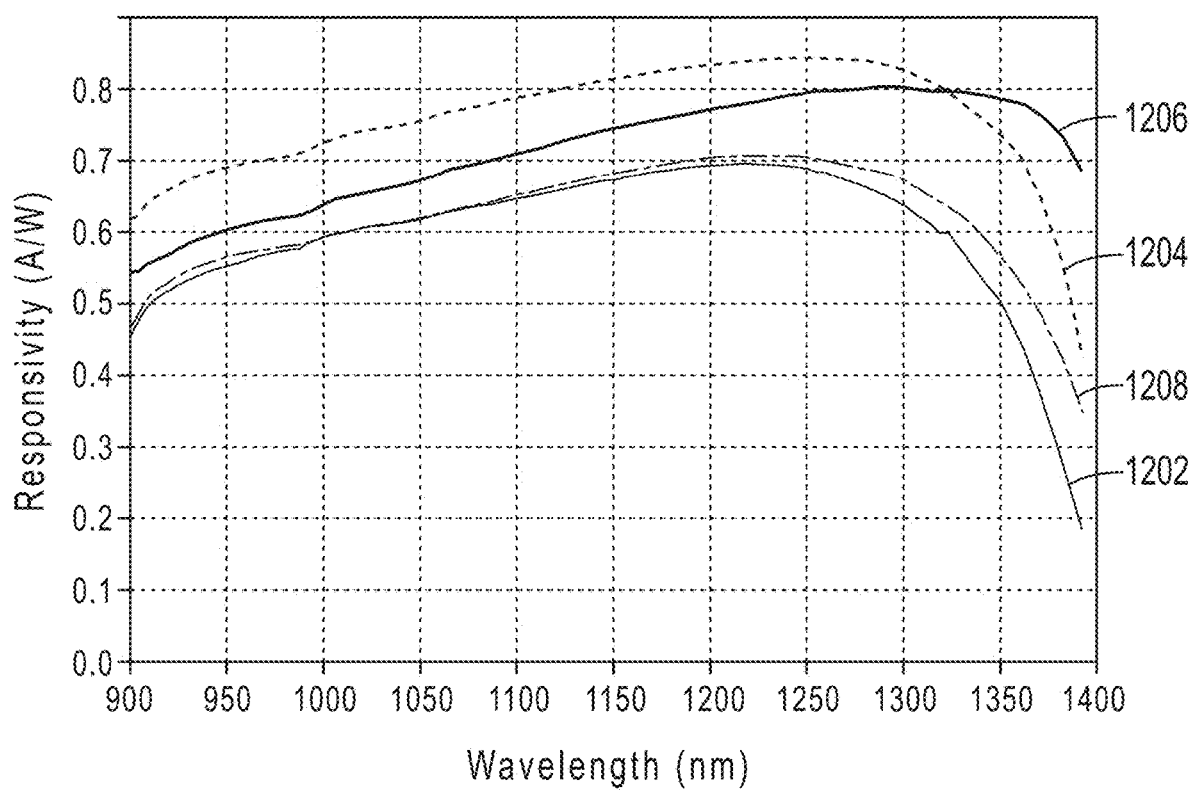
FIG. 12 shows measured responsivity curves for photodetectors according to the present invention.

FIG. 12 shows responsivity curves for four (4) photodetectors fabricated according to the present invention. Devices were fabricated by growing a GaInNAsSb on a GaAs substrate by MBE. The GaInNAsSb layer was compressively strained, with an XRD peak splitting of 600 arcsec or 800 arcsec between the GaInNAsSb dilute nitride peak and the GaAs substrate peak.

Responsivities within a range from 0.6 A/W to 0.85 A/W (at a wavelength of 1300 nm) were measured for these photodetectors. Responsivity curve 1202 is for a device having a 0.5 μm-thick GaInNAsSb dilute nitride layer and with an XRD peak splitting of 600 arcsec. Responsivity curve 1204 is for a device having a 1 μm-thick GaInNAsSb dilute nitride layer and with an XRD peak splitting of 600 arcsec. Responsivity curve 1206 is for a device having a 1.5 μm-thick GaInNAsSb dilute nitride layer and with an XRD peak splitting of 600 arcsec. Responsivity curve 1208 is for a device having a 0.5 μm thick dilute nitride layer and with an XRD peak splitting of 800 arcsec. Responsivity was measured at room temperature (23° C.-25° C.) using a broad-band halogen lamp, with light monochromatized with 10 nm wavelength steps, and calibrated using a NIST traceable InGaAs detector.

Photodetectors having a diameter of 1 mm exhibited dark currents as low as 3.6 nA at a bias voltage of 1V, measured at room temperature (23° C.-25° C.).

To assess GaInNAsSb material quality, GaInNAsSb layers were grown on undoped GaAs, with thicknesses within a range from 250 nm and 2 μm. The GaInNAsSb layers were capped with GaAs. Time-resolved photoluminescence (TRPL) measurements were performed to determine the minority carrier lifetime of the GaInNAsSb layer. TRPL is a contactless method used to characterize recombination and carrier transport in photovoltaic materials. Minority carrier lifetime for a material can be influenced by parameters including the background carrier concentration, as well as by defects that can cause non-radiative effects and carrier trapping. Lower background carrier concentrations and/or a lower number of defects can result in a longer minority carrier lifetime, which is indicative of high-quality semiconductor material. The TRPL kinetics were measured at an excitation wavelength of 970 nm, with an average CW power of 0.250 mW, and a pulse duration of 200 fs generated by a Ti:Sapphire:OPA laser. The pulse repetition rate was 250 kHz. The laser beam diameter at the sample was approximately 1 mm. Whereas typical dilute nitride materials have been reported with minority carrier lifetimes below 1 ns, materials according to the present invention have higher carrier lifetime values, with carrier lifetimes between approximately 1.1 ns and 2.5 ns. Certain GaInNAsSb layers exhibited a minority carrier lifetime greater than 2 ns.

Although background carrier concentrations of less than about $10^{16}$ cm$^{-3}$ and as low as about $10^{15}$ cm$^{-3}$ have been reported, for example, in U.S. Application Publication No. 2009/0014061, these materials exhibit minority carrier lifetimes of less than 1 ns. This indicates that background carrier concentration alone does not determine the minority carrier lifetime but that the number or concentration of defects within the material can also act as recombination centers. Although not contributing to the background carrier concentration, these defects can degrade the electrical and optical properties of the materials, resulting in reduced carrier lifetimes and inferior device performance. Minority carrier lifetimes greater than 1 ns therefore indicate lower levels of these defects and it is believed that the low defect density of the GaInNAsSb materials disclosed herein contributes to the significantly higher responsivities than previously thought achievable for dilute nitride-based photodetectors.

Example 3

Comparison of Graded Bandgap and Fixed Bandgap GaInNAsSb-Based Photodetectors Grown on GaAs Graded bandgap materials were grown by MBE with graded indium compositions varying between about 8% and 30% across the active region, with corresponding changes in nitrogen composition between about 1% and about 7%. A device incorporating a stepped/graded bandgap optical absorption active region was compared with a device incorporating a fixed bandgap optical absorption active region. The thickness of the absorbing regions for both devices was chosen to be 1 μm. The fixed bandgap dilute nitride material had a bandgap of about 0.85 eV, while the stepped/graded bandgap dilute nitride material had a bandgap that varied from about 0.85 eV to about 1.05 eV. The stepped/graded bandgap material was grown by adjusting the relative growth rates of the Ga and In cells linearly during growth, while maintaining a constant growth rate of approximately 1.5 μm/hour, producing an approximately linear Group III compositional gradient across the active region. The In Group-III fraction in the alloy varied between about 10% to about 25%. Since a change in In incorporation can lead to a change in strain in the material, the nitrogen content was also adjusted, increasing with an increase in the In composition, in order to keep the compressive strain of the material within acceptable bounds (less than about 1000 arcseconds). The nitrogen composition varied between about 2% and 5%.

Figure 20:
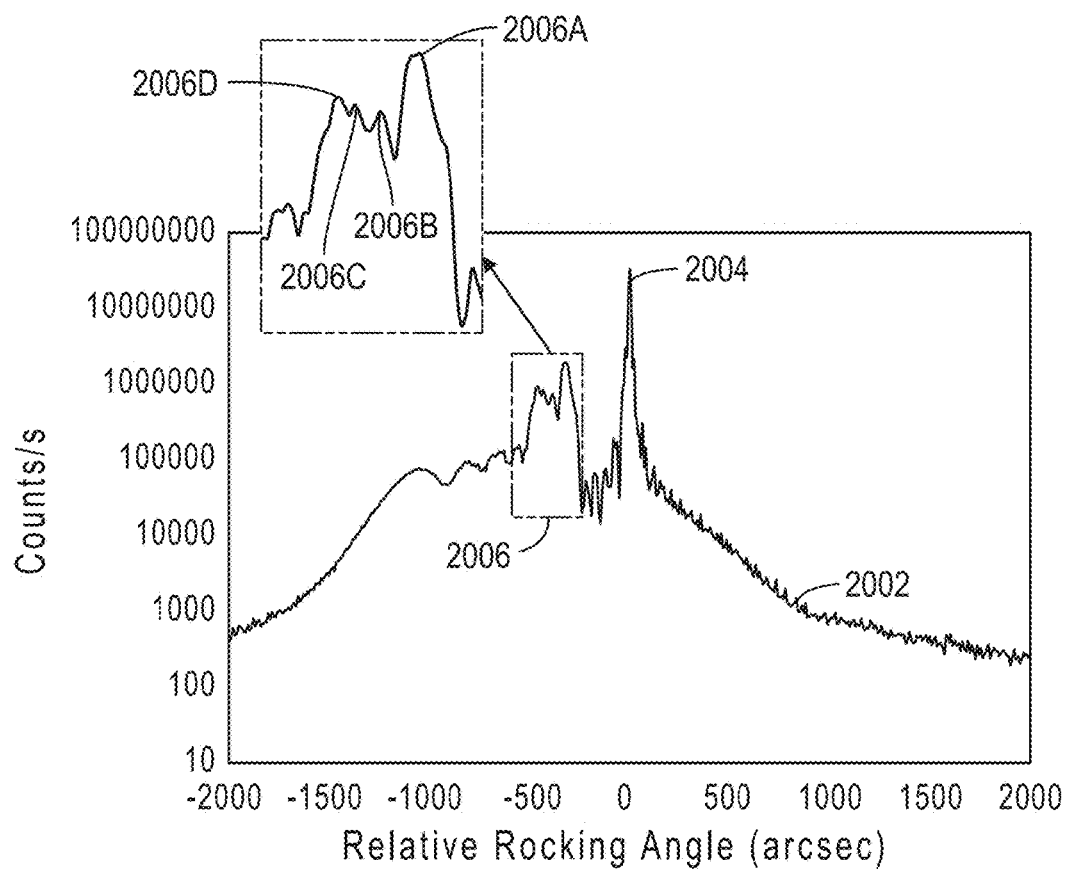
FIG. 20 shows an X-ray diffraction scan of a GaInNAsSb dilute nitride layer formed on a GaAs substrate according to the present invention.

FIG. 20 shows an X-ray diffraction scan 2002 of the stepped/graded bandgap GaInNAsSb dilute nitride layer. Scan 2002 for the material has a peak 2004 and a cluster of peaks 2006, indicating the presence of different lattice parameters. Peak 2004 corresponds to the lattice parameter of the GaAs substrate and the cluster of peaks 2006 (as opposed to a single peak 606 in FIG. 6 or 706 in FIG. 7 for a fixed bandgap material) corresponds to slightly different lattice parameters for materials within the stepped/graded bandgap GaInNAsSb layer. Four peaks, 2006A, 2006B, 2006C and 2006D exist between an arcsecond splitting from about 300 to about 600 arcseconds, each peak corresponding to a slightly different lattice constant associated with the stepped/graded bandgap GaInNAsSb layer.

Figure 21:
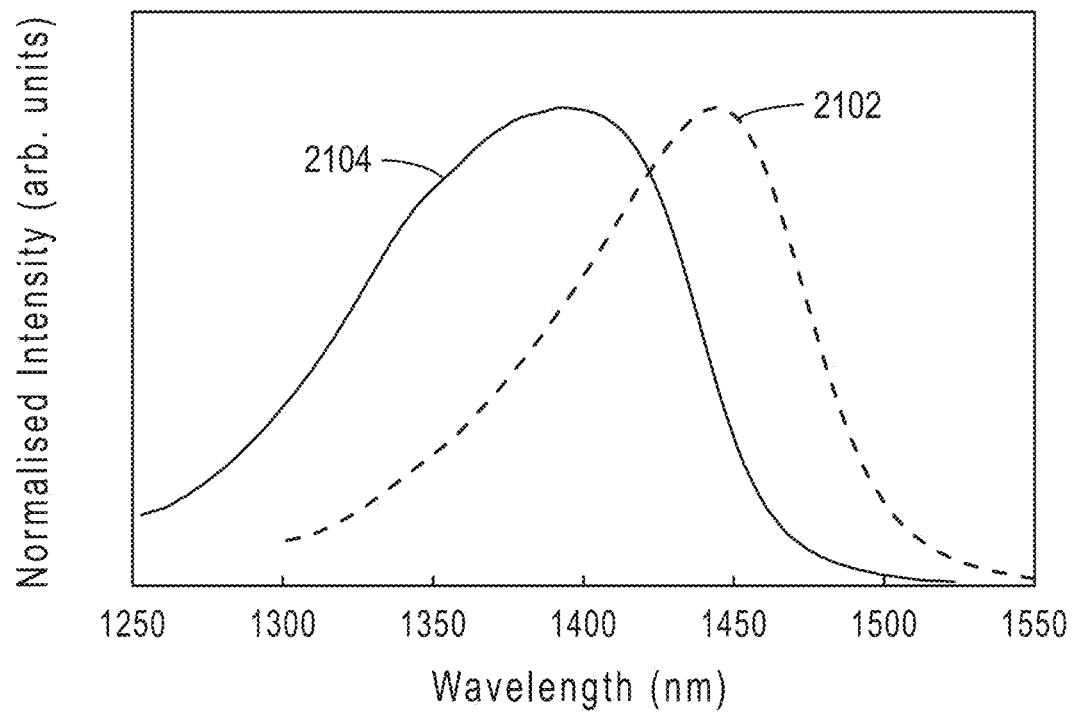
FIG. 21 shows photoluminescence spectra of GaInNAsSb dilute nitride layers grown on a GaAs substrate according to the present invention.

FIG. 21 shows a comparison of the PL spectra, measured at room temperature, for the fixed bandgap material and the stepped/graded bandgap material. The fixed bandgap sample has a PL spectrum 2102 with a peak wavelength of about 1450 nm, corresponding to an energy of 0.855 eV, while the graded bandgap sample has a PL spectrum 2104 with a peak wavelength of about 1390 nm, corresponding to an energy of 0.892 eV. The decrease in peak wavelength of the PL spectrum by 37 meV is attributed to the graded bandgap. The PL spectrum of the graded bandgap material has contributions from alloys with bandgaps as low as about 0.85 eV and from alloys with bandgaps that are higher than the energy at the peak of the PL spectrum up to about 1.05 eV, thus the PL spectrum does not provide a measure of the total bandgap change across the dilute nitride absorber material. The FWHM for PL spectrum 2102 for the fixed bandgap device was about 95 nm, whereas the graded bandgap device had a FWHM of about 130 nm for PL spectrum 2104. The broadening of the FWHM is attributed to the bandgap variation in the graded bandgap device, associated with the compositional variation in the growth direction of the active region.

Photodetectors with diameters between 100 μm and 1 mm were fabricated. For devices with a 300 μm diameter, measurements were made at room temperature (23° C.-25° C.) and compared between stepped/graded bandgap and fixed bandgap material. At shorter wavelengths, less than about 1200 nm, the responsivity of both detectors was greater than about 0.5 A/W. However, the graded/stepped bandgap detector had a reduced responsivity at longer wavelengths (greater than about 1200 nm) compared to the fixed bandgap detector, which can be attributed to the device having a lesser thickness of lower-bandgap material. At a measurement wavelength of 1350 nm, under 1 V reverse bias, the responsivity was reduced by a factor of 5 from about 0.5 A/W to 0.1 A/W. However, the dark current was reduced more, by a factor of greater than about 25, to less than about 1 nA, with some devices exhibiting dark current values of about 250 pA. Thus, the graded bandgap photodetectors had a reduced dark noise, which resulted in a higher signal-to-noise (SNR) ratio, and hence a higher responsivity, than for the fixed bandgap photodetectors. This is attributed to the reduced thickness of the lower bandgap material within the stepped/graded dilute nitride active region, since low bandgap semiconductor materials have higher dark currents than high bandgap materials.

Semiconductor optoelectronic devices of the present disclosure, such as photodetectors comprising III-V semiconductor layers can be grown on either a GaAs or a Ge substrate. The lattice constants of GaAs and Ge are 5.65 Å and 5.66 Å, respectively, and growth of III-V materials with similar compositions without defects can be grown on either substrate. The close matching of the lattice constants of Ge and GaAs allows, for example, high-quality GaAs to be epitaxially grown on a Ge surface.

Figure 13A:
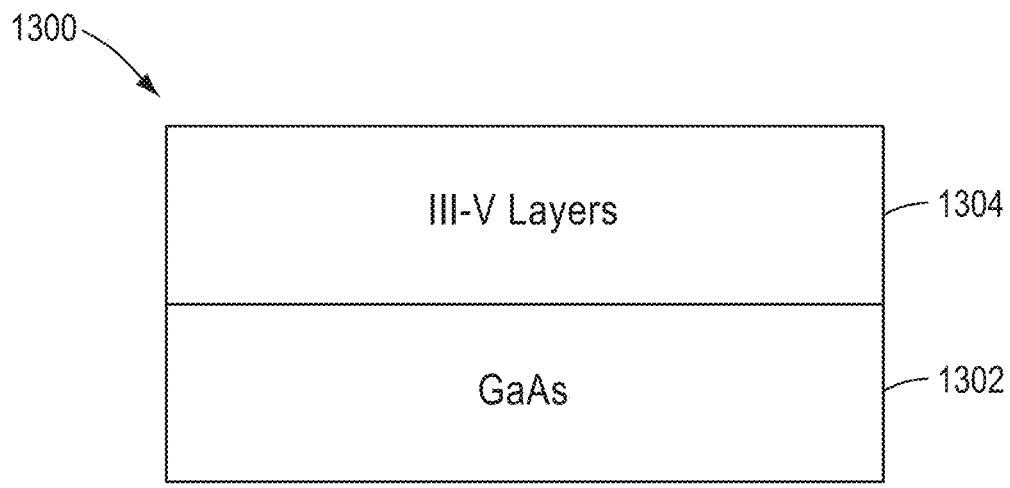
FIG. 13A shows a schematic of a device having III-V semiconductor layers grown on a GaAs substrate.
Figure 13B:
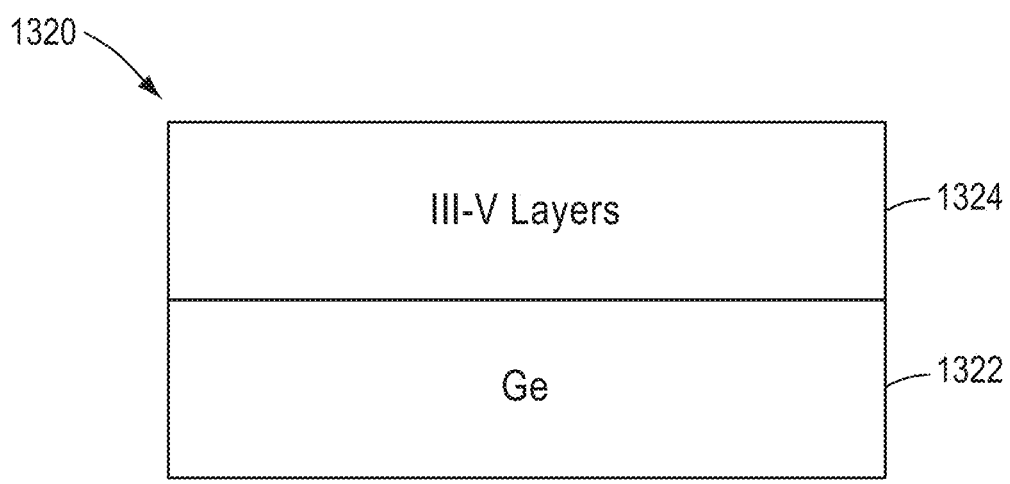
FIG. 13B shows a schematic of a device having III-V semiconductor layers grown on a Ge substrate.

FIGS. 13A and 13B depict semiconductor devices 1300 and 1320, respectively. Semiconductor device 1300 comprises III-V compound semiconductor layers 1304 epitaxially formed over a GaAs substrate 1302, and semiconductor device 1320 comprises semiconductor layers 1324 formed over a Ge substrate 1322. Semiconductor layers 1304 and 1324 are grown lattice-matched or pseudomorphically strained with respect to the substrate, ensuring the formation of high quality III-V layers.

The III-V material can also be grown on a substrate having a lattice constant closely matching that of GaAs or Ge, such as a buffered substrate. Examples of buffered silicon substrates that can provide a lattice constant approximately equal to that of GaAs or Ge include SiGe-buffered Si, SiGeSn-buffered Si, and rare-earth (RE) buffered Si, such as a rare-earth oxide (REO)-buffered Si. As will be understood by one of ordinary skill in the art, a layer such as SiGe, SiGeSn, or a RE-containing layer can form a buffer layer (or lattice engineered layer) grown on a substrate such as Si having a low number of defects and/or dislocations in the lattice engineered layer. The buffer layer can provide a lattice constant at the top of the buffer layer approximately equal to that of a GaAs or Ge substrate, facilitating the ability to form high quality III-V layers on top of the buffer layer, with a low number of defects and/or dislocations in the III-V semiconductor layers and/or dilute nitride layers. A low number of defects can include comparable or fewer defects than would occur in an $In_{0.53}Ga_{0.47}As$ layer grown on an InP substrate.

Figure 14A:
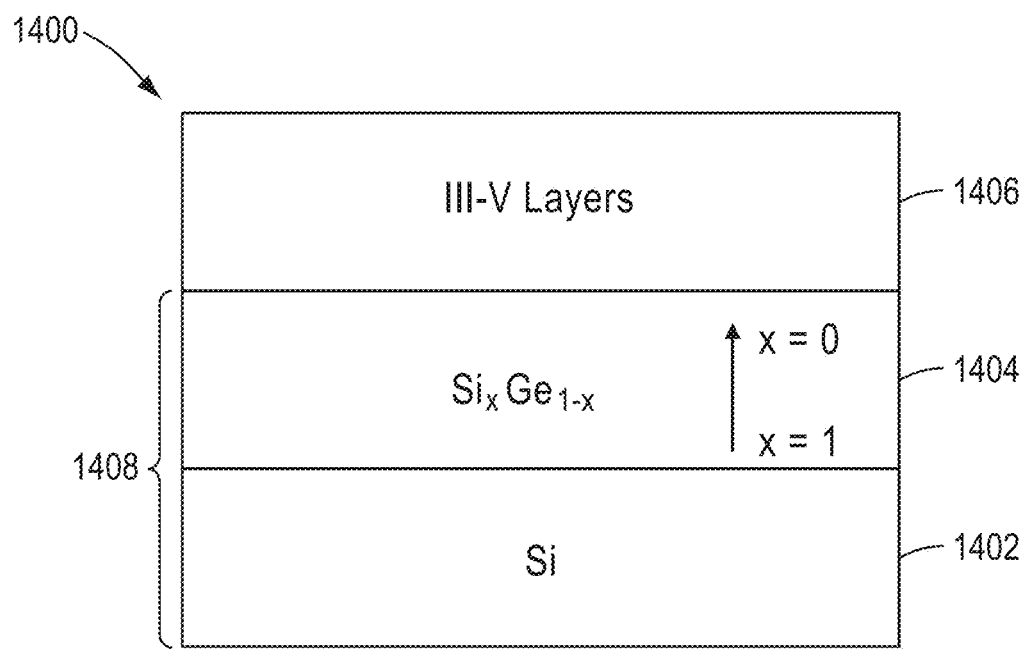
FIG. 14A shows a semiconductor device having a lattice-engineered SiGe buffer layer over a silicon substrate.
Figure 14B:
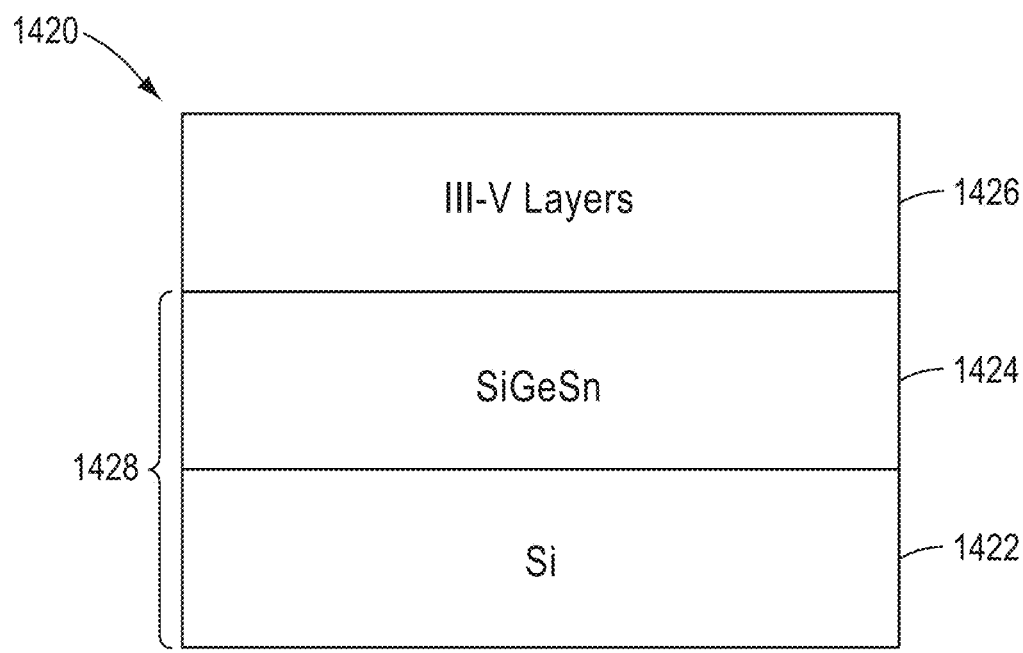
FIG. 14B shows a semiconductor device having a lattice-engineered SiGeSn buffer layer over a silicon substrate.
Figure 15:
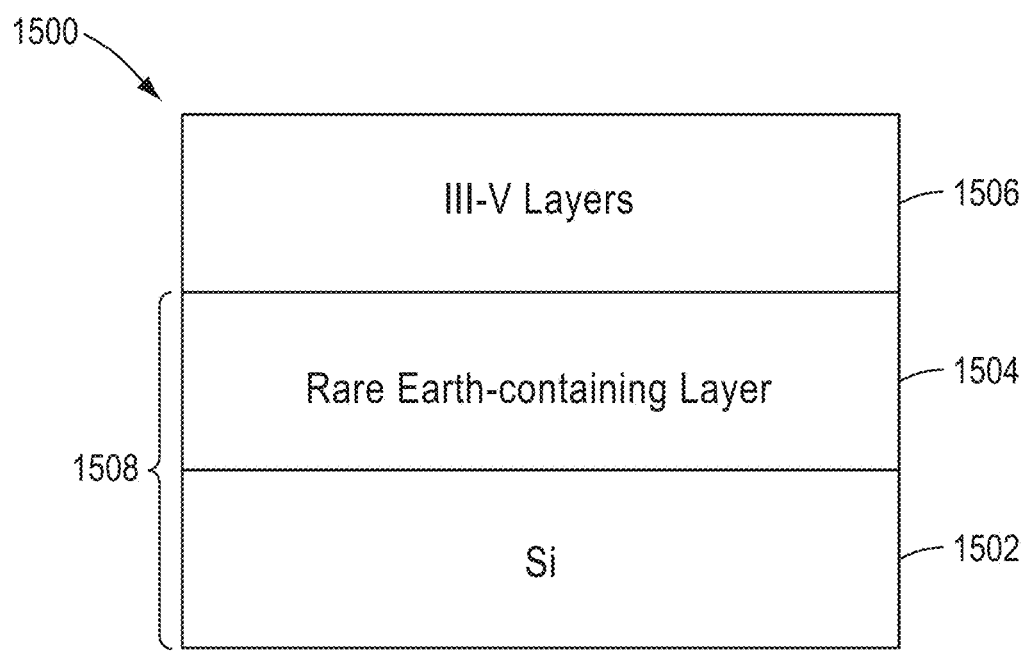
FIG. 15 shows a semiconductor device having a lattice-engineered rare earth-containing buffer layer over a silicon substrate.

FIGS. 14A, 14B and 15 show examples of III-V materials, such as photovoltaic cells, photodetectors and power converters formed over buffered substrates with lattice parameters matching or nearly matching the lattice constant of GaAs or Ge.

FIGS. 14A and 14B depict semiconductor devices 1400 and 1420, respectively, comprising a lattice-engineered buffer layer over a silicon substrate. Device 1400 comprises a silicon substrate 1402, a graded $Si_xGe_{1-x}$ ($0 \leq x \leq 1$) buffer layer 1404 overlying the Si substrate and III-V compound semiconductor layers 1406 overlying the SiGe buffer layer 1404. The Si fraction x of the graded $Si_xGe_{1-x}$ layer 1404 varies from 0 to 1 through the layer thickness. At the interface with the Si substrate 1402, x=1 and the graded $Si_xGe_{1-x}$ layer 1404 substantially only contains Si. At the interface with the III-V layers 1406, x=0 and the graded $Si_xGe_{1-x}$ layer 1404 substantially only contains Ge. Thus, the graded $Si_xGe_{1-x}$ layer 1404 provides a transition in lattice parameter from that of the Si substrate (5.43 Å) to that of Ge (5.66 Å), which nearly matches to that of GaAs (5.65 Å). Thus, the graded $Si_xGe_{1-x}$ layer 1404 allows for growth of GaAs layers on Si substrates. Together, the graded $Si_xGe_{1-x}$ layer 1404 and the silicon substrate 1402 comprise a substrate 1408 having a top surface with a lattice parameter nearly matching that of GaAs or Ge.

As shown in FIG. 14B, device 1420 comprises a silicon substrate 1422, a SiGeSn buffer 1424 overlying the Si substrate and III-V compound semiconductor layers 1426 overlying the buffer 1424. The SiGeSn buffer layer 1424 can be formed according to the method described in U.S. Pat. No. 8,029,905 and can provide a lattice constant approximately equal to that of GaAs or Ge at the interface with the overlying III-V layers 1426, thereby allowing for the growth of GaAs layers on Si substrates. Together, the SiGeSn layer 1424 and the silicon substrate 1432 comprise a substrate 1428 having a top surface with a lattice parameter nearly matching that of GaAs and Ge.

FIG. 15 depicts a semiconductor device 1500 comprising a lattice-engineered buffer layer over a silicon substrate. Device 1500 comprises a silicon substrate 1502, a rare-earth (RE)-containing buffer 1504 epitaxially formed overlying the Si substrate and III-V compound semiconductor layers 1506 overlying the buffer 1504. The RE-containing layer 1504 is a lattice-engineered layer. Rare earth elements are a specific class of elements on the periodic table (Sc, Y, La, Ce, Pr, Nd, Pm, Sm, Eu, Gd, Tb, Dy, Ho, Er, Tm, Yb, Lu). The RE containing layer can comprise one or more of the rare earth elements. Generically, the RE-containing layer can be a rare earth oxide (REO), a rare earth silicide (RESi), or a pnictide (RE-V, where V represents a group V element from the periodic chart, namely N, P, As, Sb, or Bi) or any combination of a REO, a RESi, and/or a pnictide. The composition of the RE-containing layer can be selected to result in a lattice parameter matching or nearly matching GaAs at its interface with an overlying III-V layer 1506. For example, the layer at the interface can be $ErAs_xN_{1-x}$, where x is approximately 0.9, which is lattice-matched or nearly matched to GaAs. The RE-containing layer can have constant composition or a graded composition throughout the layer thickness. When graded, the RE-containing layer can be engineered so that the portion nearest the Si is chemically and mechanically compatible with silicon. For example, gadolinium oxide can be employed at or near the interface between the silicon and RE-containing layer due to its lattice match with silicon. Thus, the RE-containing layer 1504 can provide a template for epitaxial growth of III-V layers 1506. Together, the RE-containing layer 1504 and the silicon substrate 1502 comprise a substrate 1508 having a top surface with a lattice parameter matching or nearly matching that of GaAs or Ge.

The substrates shown in FIGS. 13A to 15 can be used in any of the semiconductor devices shown in FIGS. 1 to 4.

Finally, it should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:

1. A compound semiconductor optoelectronic structure, comprising:
    a substrate having a substrate surface;
    a first doped region overlying the substrate surface;
    an active region overlying the first doped region, wherein the active region comprises:
        a dilute nitride material; and
        the active region has a bandgap that is non-uniform orthogonal to the substrate surface; and
    a second doped region overlying the active region;
    wherein the active region comprises two or more active layers; and
    wherein at least one of the two or more active layers has a non-uniform bandgap.

2. The structure of claim 1, wherein the bandgap is within a range from 0.7 eV to 1.4 eV.

3. The structure of claim 1, wherein the bandgap varies continuously within at least a portion the thickness of the active region.

4. The structure of claim 1, wherein the bandgap varies linearly throughout the thickness of the active region.

5. The structure of claim 1, wherein the bandgap varies non-linearly throughout the thickness of the active region.

6. The structure of claim 1, wherein the active region is intentionally doped.

7. The structure of claim 6, wherein the intentionally doped active region comprises a constant doping profile, a discontinuous doping profile or a continuous doping profile.

8. The structure of claim 7, wherein the discontinuous doping profile comprises a stepped doping profile.

9. The structure of claim 1, wherein each of the two or more active layers comprises a dilute nitride material.

10. The structure of claim 1, wherein each of the two or more active layers has a different bandgap than each of the other active layers.

11. The structure of claim 1, wherein each of the two or more active layers independently comprises a uniform bandgap or a non-uniform bandgap.

12. The structure of claim 1, wherein a bandgap difference between the lowest bandgap and the highest bandgap of the dilute nitride material within the active region is at least 40 meV.

13. The structure of claim 12, wherein the bandgap difference is from 40 meV to 700 meV.

14. The structure of claim 1, wherein the dilute nitride material comprises GaInNAs, GaNAsSb, GaInNAsSb, GaInNAsBi, GaNAsSbBi, GaNAsBi, GaInNAsSbBi, or a combination of any of the foregoing.

15. The structure of claim 1, wherein the dilute nitride material has a photoluminescence full-width-half-maximum (FWHM) from 50 nm to 150 nm as determined using photoluminescence spectroscopy.

16. The structure of claim 1, wherein an X-ray diffraction (XRD) pattern of the dilute nitride material exhibits a splitting from 300 arcsec to 1,000 arcsec.

17. The structure of claim 1, wherein the dilute nitride material exhibits a carrier lifetime from 1.1 nanoseconds to 2.5 nanoseconds as measured at room temperature using an excitation wavelength of 970 nm, with an average CW power of 0.250 mW, and a pulse duration of 200 fs generated by a Ti:Sapphire:OPA laser with a pulse repetition rate of 250 kHz and a laser beam diameter at the sample of 1 mm.

18. The structure of claim 1, wherein each of the first doped region and the second doped region independently has a bandgap that is greater than the largest bandgap of a material within the active region.

19. A device comprising the structure of claim 1.

20. The device of claim 19, wherein the device comprises a plurality of the semiconductor structures of claim 1.

21. The device of claim 19, wherein the device comprises a photodetector.

22. The device of claim 19, wherein the device comprises a photodetector array.

23. A method of forming a semiconductor optoelectronic device, comprising:

forming a first doped region overlying a substrate having a surface;

forming an active region overlying the first doped region, wherein,
 the active region comprises a dilute nitride material; and
 the active region has a bandgap that is non-uniform orthogonal to the substrate surface; and forming a second doped region overlying the active region;

wherein the active region comprises two or more active layers; and wherein at least one of the two or more active layers has a non-uniform bandgap.

24. The method of claim 23, wherein the device comprises a photodetector.

25. A semiconductor optoelectronic device fabricated using the method of claim 23.

26. The semiconductor optoelectronic device of claim 25, wherein the device comprises a photodetector.

27. The semiconductor optoelectronic device of claim 25, wherein the device comprises a photodetector array.

28. The semiconductor optoelectronic device of claim 25, wherein,
 the active region has a minimum bandgap; and
 the device has a dark current, wherein the dark current less than a dark current of a device having the same structure except that the active region has a constant bandgap that is equivalent to the minimum bandgap.

29. The semiconductor optoelectronic device of claim 25, wherein,
 the active region has a minimum bandgap; and
 the device has a signal-to-noise ratio, wherein the signal-to-noise ratio is higher than a signal-to-noise ratio of a device having the same structure except that the active region has a constant bandgap that is equivalent to the minimum bandgap.

* * * * *